United States Patent
Park et al.

(10) Patent No.: US 9,337,125 B2
(45) Date of Patent: *May 10, 2016

(54) INTEGRATED CIRCUIT DEVICES INCLUDING A VIA STRUCTURE AND METHODS OF FABRICATING INTEGRATED CIRCUIT DEVICES INCLUDING A VIA STRUCTURE

(71) Applicant: Samsung Electronics Co., Ltd., Suwon-si, Gyeonggi-do (KR)

(72) Inventors: Jae-hwa Park, Yongin-si (KR); Kwang-jin Moon, Hwaseong-si (KR); Byung-lyul Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 269 days.

This patent is subject to a terminal disclaimer.

(21) Appl. No.: 13/926,616

(22) Filed: Jun. 25, 2013

(65) Prior Publication Data

US 2014/0070426 A1 Mar. 13, 2014

(30) Foreign Application Priority Data

Sep. 12, 2012 (KR) ........................ 10-2012-0101147

(51) Int. Cl.
*H01L 23/48* (2006.01)
*H01L 23/52* (2006.01)
(Continued)

(52) U.S. Cl.
CPC ........ *H01L 23/481* (2013.01); *H01L 21/76898* (2013.01); *H01L 23/53238* (2013.01); *H01L 25/0657* (2013.01); *H01L 21/486* (2013.01); *H01L 23/49827* (2013.01); *H01L 23/552* (2013.01); *H01L 2224/03002* (2013.01); *H01L 2224/0401* (2013.01); *H01L 2224/0557* (2013.01); *H01L 2224/06181* (2013.01); *H01L 2224/11009* (2013.01); *H01L 2224/13* (2013.01); *H01L 2224/131* (2013.01);*H01L 2224/13007* (2013.01); *H01L 2224/13022* (2013.01);

(Continued)

(58) Field of Classification Search
CPC .......... H01L 2224/32225; H01L 2924/00012; H01L 2224/131; H01L 2924/014; H01L 2924/15311; H01L 2224/73204; H01L 2224/16225; H01L 2924/00; H01L 2924/13091; H01L 2924/1461; H01L 2924/00014; H01L 2224/05552; H01L 23/481; H01L 25/0657; H01L 21/76898; H01L 23/53238; H01L 2224/13007; H01L 2224/11009; H01L 2224/0557; H01L 2224/0401; H01L 23/552; H01L 2224/03002; H01L 2224/73253; H01L 2924/1815; H01L 2225/065

See application file for complete search history.

(56) References Cited

U.S. PATENT DOCUMENTS

| | | | |
|---|---|---|---|
| 7,282,444 B2 | 10/2007 | Tanida et al. | |
| 8,076,234 B1 | 12/2011 | Park et al. | |
| 8,207,595 B2 * | 6/2012 | Hsieh | H01L 21/76898 257/621 |
| 8,598,687 B2 * | 12/2013 | Hsieh | H01L 21/76898 257/621 |

(Continued)

FOREIGN PATENT DOCUMENTS

| KR | 1020050066362 A | 6/2005 |
|---|---|---|
| KR | 1020100129536 A | 12/2010 |

(Continued)

*Primary Examiner* — Victor A Mandala
(74) *Attorney, Agent, or Firm* — Myers Bigel & Sibley, P.A.

(57) ABSTRACT

Integrated circuit devices are provided. The integrated circuit devices may include a via structure including a conductive plug, a conductive barrier layer spaced apart from the conductive plug, and an insulating layer between the conductive plug and conductive barrier layer. Related methods of forming integrated circuit devices are also provided.

18 Claims, 29 Drawing Sheets

(51) Int. Cl.
*H01L 29/40* (2006.01)
*H01L 23/532* (2006.01)
*H01L 25/065* (2006.01)
*H01L 21/768* (2006.01)
*H01L 21/48* (2006.01)
*H01L 23/498* (2006.01)
*H01L 23/552* (2006.01)

(52) U.S. Cl.
CPC .......... *H01L2224/13082* (2013.01); *H01L 2224/16145* (2013.01); *H01L 2224/16225* (2013.01); *H01L 2224/32225* (2013.01); *H01L 2224/73204* (2013.01); *H01L 2224/73253* (2013.01); *H01L 2225/06513* (2013.01); *H01L 2225/06517* (2013.01); *H01L 2225/06541* (2013.01); *H01L 2924/00014* (2013.01); *H01L 2924/13091* (2013.01); *H01L 2924/1461* (2013.01); *H01L 2924/15311* (2013.01); *H01L 2924/1815* (2013.01)

(56) References Cited

U.S. PATENT DOCUMENTS

| | | | |
|---|---|---|---|
| 2005/0150683 | A1* | 7/2005 | Farnworth ............ H01L 21/486 174/255 |
| 2008/0283277 | A1 | 11/2008 | Muramatsu et al. |
| 2011/0108988 | A1 | 5/2011 | Lim et al. |
| 2011/0133333 | A1* | 6/2011 | Kwon ............... H01L 21/76898 257/737 |
| 2011/0304057 | A1 | 12/2011 | Matsumoto |
| 2012/0001330 | A1 | 1/2012 | Huisinga et al. |
| 2012/0074584 | A1 | 3/2012 | Lee et al. |
| 2012/0094437 | A1 | 4/2012 | Han et al. |
| 2014/0061839 | A1* | 3/2014 | Ting .................. H01L 27/14636 257/435 |

FOREIGN PATENT DOCUMENTS

| | | |
|---|---|---|
| KR | 1020110125847 A | 11/2011 |
| KR | 101095055 B1 | 12/2011 |
| KR | 1020120002499 A | 1/2012 |

* cited by examiner

INTEGRATED CIRCUIT DEVICES INCLUDING A VIA STRUCTURE AND METHODS OF FABRICATING INTEGRATED CIRCUIT DEVICES INCLUDING A VIA STRUCTURE

CROSS-REFERENCE TO RELATED APPLICATION

This U.S. non-provisional patent application claims priority under 35 U.S.C. §119 to Korean Patent Application No. 10-2012-0101147, filed on Sep. 12, 2012, in the Korean Intellectual Property Office, the disclosure of which is hereby incorporated herein by reference in its entirety.

BACKGROUND

The present disclosure relates to integrated circuit devices and methods of forming integrated circuit devices. Three-dimensional (3D) packages including a plurality of semiconductor chips mounted on a single semiconductor package may be implemented for integrated circuit devices. Accordingly, through-silicon-via (TSV) technology for forming a vertical electric connection through a substrate or a die may be beneficial. Copper (Cu) diffusion in a TSV structure including a Cu contact plug, however, may cause performance and reliability problems for 3D packages.

SUMMARY

Various embodiments of the present inventive concepts provide an integrated circuit device. The integrated circuit device may include a semiconductor structure and a through-silicon-via (TSV) structure in the semiconductor structure. The TSV structure may include a conductive plug, a conductive barrier film spaced apart from the conductive plug and surrounding the conductive plug, and an insulating thin film between the conductive plug and the conductive barrier film. In some embodiments, the conductive plug may include a first metal, and the conductive barrier film may include a second metal different from the first metal. In some embodiments, the integrated circuit device may include a via insulating film between the semiconductor structure and the conductive barrier film. The insulating thin film may include a first thickness and the via insulating film may include a second thickness thicker than the first thickness.

According to various embodiments, the integrated circuit device may include a conductive layer on a surface of the semiconductor structure and contacting an end of the conductive plug and an end of the conductive barrier film. The end of the conductive plug may include a first end of the conductive plug. The end of the conductive barrier film may include a first end of the conductive barrier film. The surface may include a first surface. The conductive layer may include a first conductive layer on the first surface. The integrated circuit device may include a second conductive layer on a second surface of the semiconductor structure opposite the first surface, the second conductive layer contacting a second end of the conductive plug and a second end of the conductive barrier film. The conductive plug and the conductive barrier film may be configured to be electrically connected to each other via the first conductive layer and the second conductive layer such that the conductive plug and the conductive barrier film share an equipotential state.

In various embodiments, the conductive barrier film may include a substantially uniform thickness in a lengthwise direction of the TSV structure. In some embodiments, the insulating thin film may include a substantially uniform thickness in a lengthwise direction of the TSV structure. The conductive barrier film may include a first conductive barrier film. The conductive plug may include a metal plug in the semiconductor structure and surrounded by the insulating thin film, and may include a second conductive barrier film surrounding the metal plug between the metal plug and the insulating thin film. The first conductive barrier film may include a substantially uniform thickness in a lengthwise direction of the TSV structure. The second conductive barrier film may include a variable thickness in a lengthwise direction of the TSV structure.

According to various embodiments, the semiconductor structure may include a semiconductor substrate and an interlayer insulating film on the semiconductor substrate. Moreover, the conductive plug, the insulating thin film, and the conductive barrier film may each extend in the semiconductor substrate and the interlayer insulating film. In some embodiments, the semiconductor structure may include a semiconductor substrate, an interlayer insulating film on the semiconductor substrate, and a metal interlayer insulating film on the interlayer insulating film. The conductive plug, the insulating thin film, and the conductive barrier film may each extend in the semiconductor substrate, the interlayer insulating film, and the metal interlayer insulating film.

An integrated circuit device, according to various embodiments, may include a package substrate including a connection terminal. The integrated circuit device may include at least one semiconductor chip that is on the package substrate and that includes a semiconductor substrate and a through-silicon-via structure (TSV) in the semiconductor substrate. The TSV structure may include a conductive plug connected to the connection terminal, a conductive barrier film spaced apart from the conductive plug, the conductive barrier film surrounding the conductive plug and connecting to the connection terminal, and an insulating thin film between the conductive plug and the conductive barrier film. In some embodiments, the at least one semiconductor chip may include a plurality of conductive layers on the semiconductor substrate. The conductive plug and the conductive barrier film may be configured to be electrically connected to each other via at least one conductive layer among the plurality of the conductive layers such that the conductive plug and the conductive barrier film share an equipotential state.

According to various embodiments, the integrated circuit device may include a conductive layer between the package substrate and the at least one semiconductor chip. The conductive layer may be configured to electrically connect the package substrate to the at least one semiconductor chip. The conductive plug and the conductive barrier film may be configured to be electrically connected to each other via the conductive layer such that the conductive plug and the conductive barrier film share an equipotential state. In some embodiments, the conductive layer may include a solder bump.

Methods of fabricating an integrated circuit device, according to various embodiments, may include forming a via hole in a semiconductor structure. The methods may include forming a via insulating film on an inner wall of the via hole. The methods may include forming a conductive barrier film on the via insulating film in the via hole. The methods may include forming an insulating thin film on the conductive barrier film in the via hole. Moreover, the methods may include forming a conductive plug spaced apart from the conductive barrier film on the insulating thin film in the via hole. In some embodiments, the via insulating film may include a first thickness in the via hole. The insulating thin film may include a second thickness thinner than the first thickness in the via hole. In some embodiments, the conductive barrier film may include a substantially uniform thickness in a lengthwise direction of the via hole. In some embodiments, the insulating thin film may include a substantially uniform thickness in a lengthwise direction of the via hole.

According to various embodiments, the conductive barrier film may include a first conductive barrier film. Moreover, forming the conductive plug may include forming a second conductive barrier film on the insulating thin film in the via hole, and forming a metal plug on the second conductive barrier film in the via hole. In some embodiments, a first thickness of a portion of the second conductive barrier film adjacent a first end of the via hole may include a first thickness thicker than a second thickness of a portion of the second conductive barrier film adjacent a second end of the via hole.

Methods of fabricating an integrated circuit device, according to various embodiments, may include forming a via hole in a semiconductor substrate. The methods may include forming a via insulating film on an inner wall of the via hole. The methods may include forming a through-silicon-via (TSV) structure on the via insulating film in the via hole. The TSV structure may include a conductive plug, a conductive barrier film spaced apart from the conductive plug and surrounding the conductive plug, and an insulating thin film between the conductive plug and the conductive barrier film. Moreover, the methods may include forming a conductive layer extending from an end of the conductive plug to an end of the conductive barrier film on a side of the TSV structure. In some embodiments, forming the TSV structure may include forming the insulating thin film to a first thickness thinner than a second thickness of the via insulating film.

An integrated circuit device, according to various embodiments, may include a semiconductor structure including first and second portions. The integrated circuit device may include a via structure between the first and second portions of the semiconductor structure. The via structure may include a conductive plug, a conductive barrier layer spaced apart from the conductive plug, and an insulating layer between the conductive plug and conductive barrier layer. In some embodiments, the integrated circuit device may include a conductive layer on an end of the conductive plug and an end of the conductive barrier layer. The conductive layer may extend from a surface of the first portion of the semiconductor structure to a surface of the second portion of the semiconductor structure. Moreover, the surface of the first portion of the semiconductor structure, the surface of the second portion of the semiconductor structure, the end of the conductive plug, and the end of the conductive barrier layer may be substantially coplanar.

According to various embodiments, the via structure may include a through-silicon-via structure. The conductive barrier layer may include a first conductive barrier layer. The conductive plug may include a metal plug and a second conductive barrier layer between the insulating layer and the metal plug. Moreover, the second conductive barrier layer may include a non-uniform thickness.

BRIEF DESCRIPTION OF THE DRAWINGS

The above and other features and advantages of the disclosure will become more apparent in view of the attached drawings and accompanying detailed description.

DETAILED DESCRIPTION

Figure 1A:
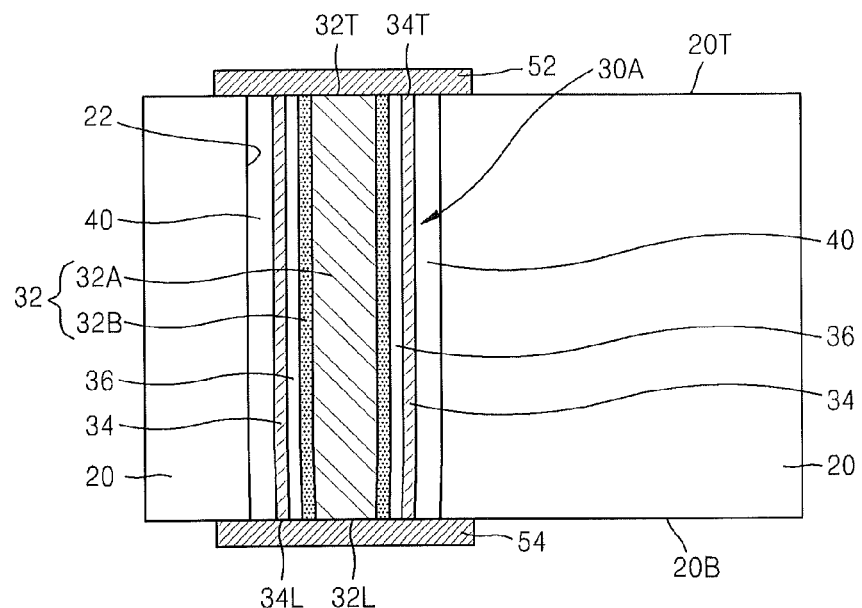
FIG. 1A is a cross-sectional view illustrating an integrated circuit device according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1A is a cross-sectional view illustrating an integrated circuit device 10A according to some embodiments. The integrated circuit device 10A may include a semiconductor structure 20, and a through-silicon-via (TSV) structure 30A passing through the semiconductor structure 20 via a via hole 22 formed in the semiconductor structure 20.

The TSV structure 30A may include a conductive plug 32, and a first conductive barrier film 34 surrounding the conductive plug 32 and spaced apart from the conductive plug 32 at an interval therebetween. An insulating thin film 36 may be interposed between the conductive plug 32 and the first conductive barrier film 34.

The conductive plug 32 may include a metal plug 32A passing through the semiconductor structure 20, and a second conductive barrier film 32B surrounding an outer sidewall of the metal plug 32A and passing through the semiconductor structure 20. The second conductive barrier film 32B may be interposed between the metal plug 32A and the insulating thin film 36. In some embodiments, the second conductive barrier film 32B may be omitted, and the metal plug 32A may directly contact the insulating thin film 36.

The metal plug 32A may include a first metal, and each of the first conductive barrier film 34 and the second conductive barrier film 32B may include a metal that is different from the first metal.

In some embodiments, the metal plug 32A may include Copper (Cu) or Tungsten (W). For example, the metal plug 32A may include Cu, Copper-Tin (CuSn), Copper-Magnesium (CuMg), Copper-Nickel (CuNi), Copper-Zinc (CuZn), Copper-Palladium (CuPd), Copper-Gold (CuAu), Copper-Rhenium (CuRe), CuW, W, or W alloy, but is not limited thereto.

The second conductive barrier film 32B surrounding the sidewall of the metal plug 32A may be a single or multiple film including at least one material selected from W, Tungsten Nitride (WN), Tungsten Carbide (WC), Titanium (Ti), Titanium Nitride (TiN), Tantalum (Ta), Tantalum Nitride (TaN), Ruthenium (Ru), Cobalt (Co), Manganese (Mn), Nickel (Ni), and Nickel Boron (NiB). In some embodiments, the second conductive barrier film 32B may be formed by using a physical vapor deposition (PVD) process or a chemical vapor deposition (CVD) process. In other embodiments, the second conductive barrier film 32B may be formed by using an atomic layer deposition (ALD) process.

In some embodiments, the second conductive barrier film 32B may have a uniform thickness along a lengthwise direction of the TSV structure 30A. Herein, the lengthwise direction of the TSV structure 30A refers to a direction of a shortest length from a first surface 20T to a second surface 20B, which is opposite the first surface 20T, of the semiconductor structure 20. In the present application, the phrases "a lengthwise direction of the via hole 22" and "the lengthwise direction of the TSV structure 30A" have the same meaning.

The first conductive barrier film 34 may be a conductive layer having a relatively low interconnection line resistance. For example, the first conductive barrier film 34 may be a single or multiple film including at least one selected from W, WN, Ti, TiN, Ta, TaN, and Ru. For example, the first conductive barrier film 34 may be a multiple film formed of TaN/W, TiN/W, or WN/W. The first conductive barrier film 34 may have a thickness of about 50 to about 1000 Angstroms (Å). In some embodiments, the first conductive barrier film 34 may have a uniform thickness in the lengthwise direction of the TSV structure 30A. The first conductive barrier film 34 may be formed by using an ALD process or a CVD process.

The insulating thin film 36 may have a cylindrically-shaped structure surrounding the conductive plug 32. The insulating thin film 36 may be an oxide film, a nitride film, an insulating metal oxide film, a high-dielectric-constant film, a polymer, or a combination thereof. The insulating thin film 36 may be a high-density thin film having a uniform thickness along the lengthwise direction of the TSV structure 30A. For example, the insulating thin film 36 may be a thin film obtained by performing an ALD process.

The insulating thin film 36 may be a high-dielectric-constant film having a higher dielectric constant than that of a silicon oxide film. For example, the insulating thin film 36 may have a dielectric constant of about 10 to about 25. In some embodiments, the insulating thin film 36 may include at least one material selected from hafnium oxide (HfO), hafnium silicon oxide (HfSiO), hafnium oxidation nitride (HfON), hafnium silicon oxidation nitride (HfSiON), lanthanum oxide (LaO), lanthanum aluminum oxide (LaAlO), zirconium oxide (ZrO), zirconium silicon oxide (ZrSiO), zirconium oxidation nitride (ZrON), zirconium silicon oxidation nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

The integrated circuit device 10A may further include a via insulating film 40 interposed between the semiconductor structure 20 and the first conductive barrier film 34. The via insulating film 40 may separate the semiconductor structure 20 from the TSV structure 30A.

The via insulating film 40 may be an oxide film, a nitride film, a carbide film, a polymer, or a combination thereof. In some embodiments, a CVD process may be used to form the via insulating film 40. The via insulating film 40 may be formed to have a thickness of about 500 to about 2500 Å.

The insulating thin film 36 may be spaced apart from the via insulating film 40 with the first conductive barrier film 34 interposed therebetween. To minimize/reduce a resistance of the TSV structure 30A, the insulating thin film 36 may be formed to have as small of a thickness as possible. In some embodiments, the thickness of the insulating thin film 36 may be smaller than the thickness of the via insulating film 40. In some embodiments, the insulating thin film 36 may have a thickness of about 50 to about 1000 Å.

A first conductive layer 52 contacting an end 32T of the conductive plug 32 and an end 34T of the first conductive barrier film 34 may be formed on the first surface 20T of the semiconductor structure 20. A second conductive layer 54 contacting another end 32L of the conductive plug 32 and another end 34L of the first conductive barrier film 34 may be formed on the second surface 20B of the semiconductor structure 20. The conductive plug 32 and the first conductive barrier film 34 may be mutually electrically connected to each other via each of the first conductive layer 52 and the second conductive layer 54, in such a way that when a voltage is applied to the TSV structure 30A, the conductive plug 32 and the first conductive barrier film 34 mutually have equipotential states.

The first conductive layer 52 and the second conductive layer 54 may each include metal. Because the conductive plug 32 and the first conductive barrier film 34 are both connected to the first conductive layer 52 and the second conductive layer 54, a voltage supplied by any conductive layer of the first conductive layer 52 and the second conductive layer 54 to the conductive plug 32 may be simultaneously supplied to the first conductive barrier film 34, so that the conductive plug 32 and the first conductive barrier film 34 may be in an equipotential state. For example, when the conductive plug 32 includes a metal ion that easily diffuses due to a potential difference, such as a Cu ion, because the first conductive barrier film 34, which has an equipotential state with respect to the conductive plug 32, with the insulating thin film 36 interposed therebetween, surrounds the conductive plug 32, diffusion of metal ions from the conductive plug 32 into the semiconductor structure 20 due to a potential difference may be electrically shielded against. Accordingly, problems caused by the diffusion of metal ions into the semiconductor structure 20 due to a potential difference, including, for example, problems of deterioration of operational characteristics of unit devices such as a transistor, and a decrease in reliability of the TSV structure 30A, occurring when metal ions diffuse into the via insulating film 40, may be prevented/reduced.

In some embodiments, a semiconductor substrate of the semiconductor structure 20 may be, for example, a silicon substrate. In addition, the TSV structure 30A may have a sidewall surrounded by the semiconductor substrate.

In some embodiments, the semiconductor structure 20 may include a semiconductor substrate and an interlayer insulating film covering the semiconductor substrate. The conductive plug 32, the insulating thin film 36, and the first conductive barrier film 34, which constitute the TSV structure 30A, may each pass through the semiconductor substrate and the interlayer insulating film. The TSV structure 30A may have a sidewall surrounded by the semiconductor substrate, and a sidewall surrounded by the interlayer insulating film.

In some embodiments, the semiconductor structure 20 may include a semiconductor substrate, an interlayer insulating film covering the semiconductor substrate, and a metal interlayer insulating film covering the interlayer insulating film. The conductive plug 32, the insulating thin film 36, and the first conductive barrier film 34, which constitute the TSV structure 30A, may each pass through the semiconductor substrate, the interlayer insulating film, and the metal interlayer insulating film covering the interlayer insulating film. In addition, the conductive plug 32, the insulating thin film 36, and the first conductive barrier film 34 of the TSV structure 30A may each have a sidewall surrounded by the semiconductor substrate, a sidewall surrounded by the interlayer insulating film, and a sidewall surrounded by the metal interlayer insulating film.

Figure 1B:
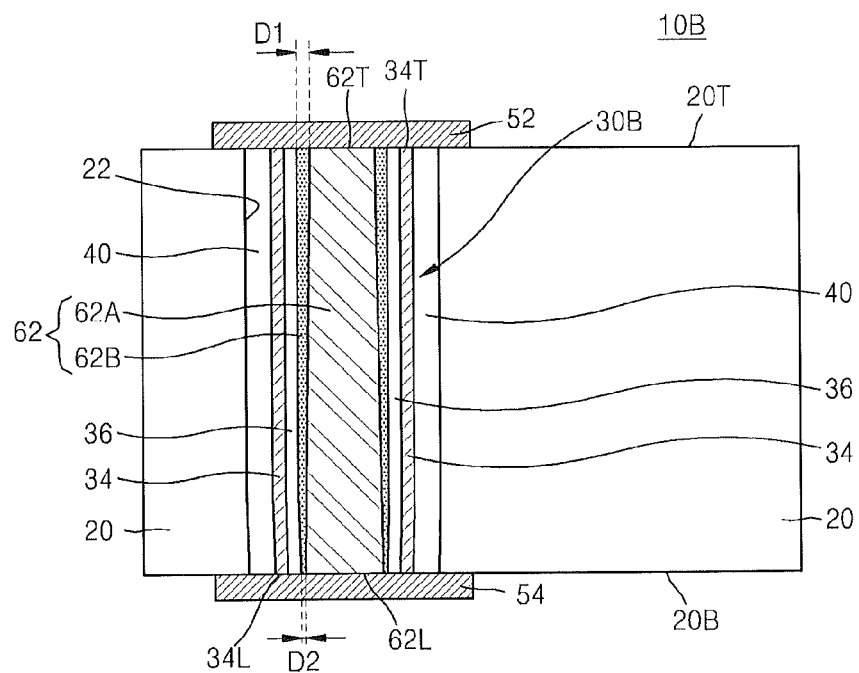
FIG. 1B is a cross-sectional view illustrating an integrated circuit device according to some embodiments.

FIG. 1B is a cross-sectional view illustrating an integrated circuit device 10B according to some embodiments. In FIGS. 1B and 1A, the same reference numerals denote the same reference elements and, accordingly, a repeated detailed description of the elements denoted by the same reference numerals may be omitted. Referring to FIG. 1B, the integrated circuit device 10B may include a semiconductor structure 20, and a through-silicon-via (TSV) structure 30B passing through the semiconductor structure 20 via a via hole 22 formed in the semiconductor structure 20.

The TSV structure 30B may include a conductive plug 62, a first conductive barrier film 34 that is spaced apart from the conductive plug 62 and surrounds the conductive plug 62, and an insulating thin film 36 interposed between the conductive plug 62 and the first conductive barrier film 34. The conductive plug 62 may include a metal plug 62A passing through the semiconductor structure 20, and a second conductive barrier film 62B surrounding an outer sidewall of the metal plug 62A and passing through the semiconductor structure 20.

The first conductive barrier film 34 may have a uniform thickness along the lengthwise direction of the TSV structure 30B from the first surface 20T to the second surface 20B of the semiconductor structure 20. For example, the first conductive barrier film 34 may have a thickness of about 50 to about 1000 Å. To form the first conductive barrier film 34 having a uniform thickness along the lengthwise direction of the via hole 22 as described herein, an ALD process may be used.

The thickness of the second conductive barrier film 62B may decrease in a direction from the first surface 20T to the second surface 20B of the semiconductor structure 20. For example, the second conductive barrier film 62B may have a first thickness D1 of about 100 to about 1000 Å in the vicinity of an inlet of the via hole 22 on the side of the first surface 20T of the semiconductor structure 20, and may have a second thickness D2 of about 0 to about 50 Å in the vicinity of an inlet of the via hole 22 on the side of the second surface 20B of the semiconductor structure 20. To form the second conductive barrier film 62B having a thickness that varies in a lengthwise direction of the via hole 22 as described herein, a PVD process may be used.

Figure 2:
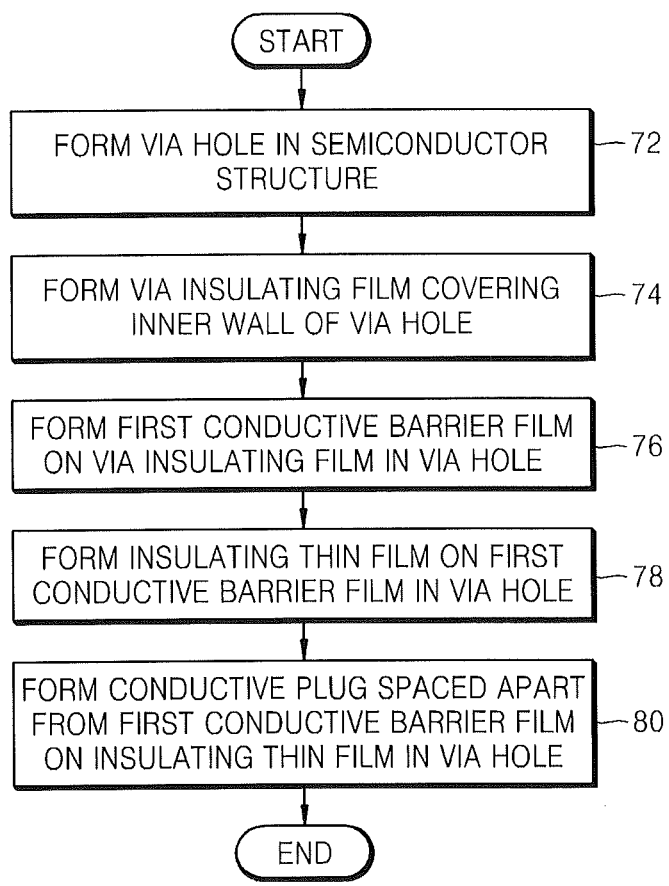
FIG. 2 is a flowchart illustrating a method of fabricating an integrated circuit device according to some embodiments.

FIG. 2 is a flowchart illustrating a method of fabricating an integrated circuit device according to some embodiments. Repeated descriptions of elements presented with reference to FIGS. 1A and 1B may be omitted. Referring to FIGS. 1A, 1B, and 2, in a process 72, a via hole 22 may be formed in the semiconductor structure 20. In a process 74, the via insulating film 40 covering an inner wall of the via hole 22 may be formed. The via insulating film 40 may be formed by using a low temperature CVD process or a plasma enhanced CVD (PECVD) process.

In a process 76, the first conductive barrier film 34 may be formed on the via insulating film 40 inside the via hole 22. To form the first conductive barrier film 34, an ALD process or a CVD process, which may be suitable for forming a low-resistance high density thin film with a uniform thickness at a relatively low temperature and low resistance, may be used. The first conductive barrier film 34 may be formed to have a relatively uniform thickness in the lengthwise direction of the via hole 22 from the first surface 20T to the second surface 20B of the semiconductor structure 20.

In a process 78, the insulating thin film 36 may be formed on the first conductive barrier film 34 inside the via hole 22. The insulating thin film 36 may be formed to have a thickness that is smaller than that of the via insulating film 40. To form the insulating thin film 36, an ALD process or a CVD process may be used.

In a process 80, the conductive plug 32 or 62 spaced apart from the first conductive barrier film 34 may be formed on the insulating thin film 36 inside the via hole 22. In some embodiments, as illustrated in FIG. 1A, the conductive plug 32 comprising the second conductive barrier film 32B having a relatively uniform thickness along the lengthwise direction of the via hole 22, and comprising the metal plug 32A filling the remaining space of the via hole 22 on the second conductive barrier film 32B, may be formed. Alternatively, as illustrated in FIG. 1B, the conductive plug 62 comprising the second conductive barrier film 62B having a variable thickness along the lengthwise direction of the via hole 22, and comprising the metal plug 62A filling the remaining space of the via hole 22 on the second conductive barrier film 62B, may be formed.

Figure 3:
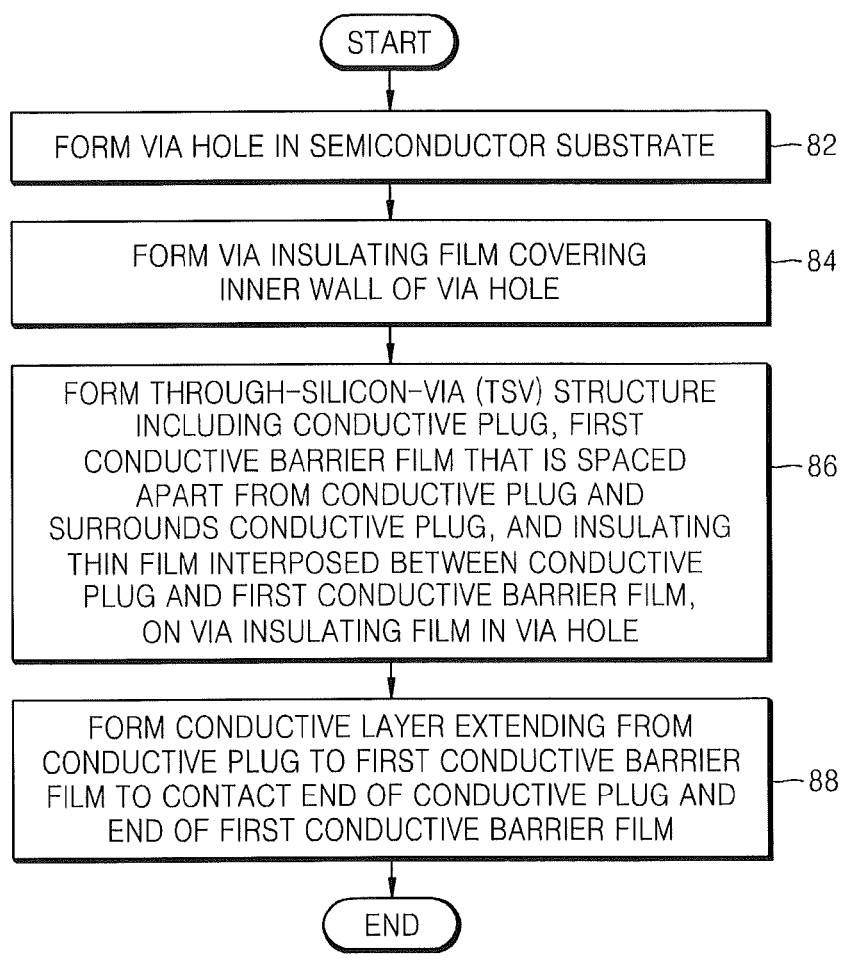
FIG. 3 is a flowchart illustrating a method of fabricating an integrated circuit device according to some embodiments.

FIG. 3 is a flowchart illustrating a method of fabricating an integrated circuit device according to some embodiments. Repeated descriptions of elements presented with reference to FIGS. 1A and 1B may be omitted. Referring to FIGS. 1A, 1B, and 3, in a process 82, the via hole 22 may be formed in a semiconductor substrate. The semiconductor substrate may constitute the semiconductor structure 20 illustrated in FIGS. 1A and 1B.

In a process 84, the via insulating film 40 covering the inner wall of the via hole 22 may be formed in the same manner as in the process 74 in FIG. 2. In a process 86, the TSV structure 30A or 30B may be formed on the via insulating film 40 inside the via hole 22. In some embodiments, as illustrated in FIG. 1A, the TSV structure 30A including the conductive plug 32 that includes the second conductive barrier film 32B having a relatively uniform thickness in the lengthwise direction of the via hole 22, the first conductive barrier film 34 that is spaced apart from the conductive plug 32 and surrounds the conductive plug 32, and the insulating thin film 36 interposed between the conductive plug 32 and the first conductive barrier film 34, may be formed. Alternatively, as illustrated in FIG. 1B, the TSV structure 30B including the conductive plug 62 that includes the second conductive barrier film 62B having a variable thickness in the lengthwise direction of the via hole 22, the first conductive barrier film 34 that is spaced apart from the conductive plug 62 and surrounds the conductive plug 62, and the insulating thin film 36 interposed between the conductive plug 62 and the first conductive barrier film 34, may be formed.

In a process 88, the first conductive layer 52 extending from the conductive plug 32 or 62 to the first conductive barrier film 34 to contact the end 32T or 62T of the conductive plug 32 or 62 and the end 34T of the first conductive barrier film 34 may be formed on the semiconductor substrate. In some embodiments, the second conductive layer 54 extending from the conductive plug 32 or 62 to the first conductive barrier film 34 to contact another end 32L or 62L of the conductive plug 32 or 62 and another end 34L of the first conductive barrier film 34 may be formed on the semiconductor substrate.

Detailed examples of the integrated circuit devices 10A and 10B, and the methods of fabricating integrated circuit devices illustrated in FIGS. 2 and 3, may be presented by FIGS. 4A-14.

Figure 4A:
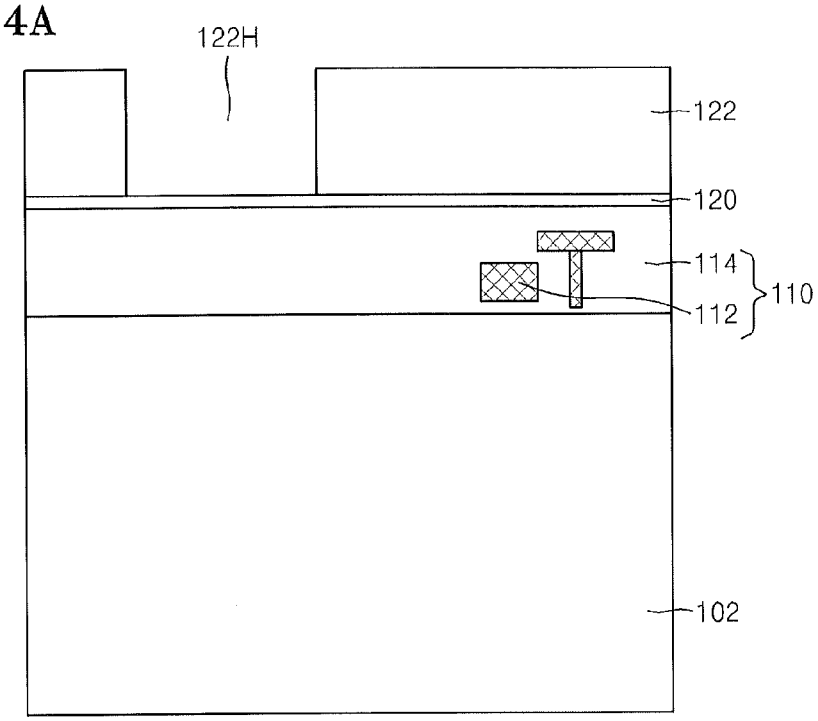
FIGS. 4A to 4N are cross-sectional views, which are sequentially illustrated according to a process sequence, illustrating a method of fabricating an integrated circuit device according to some embodiments.
Figure 4B:
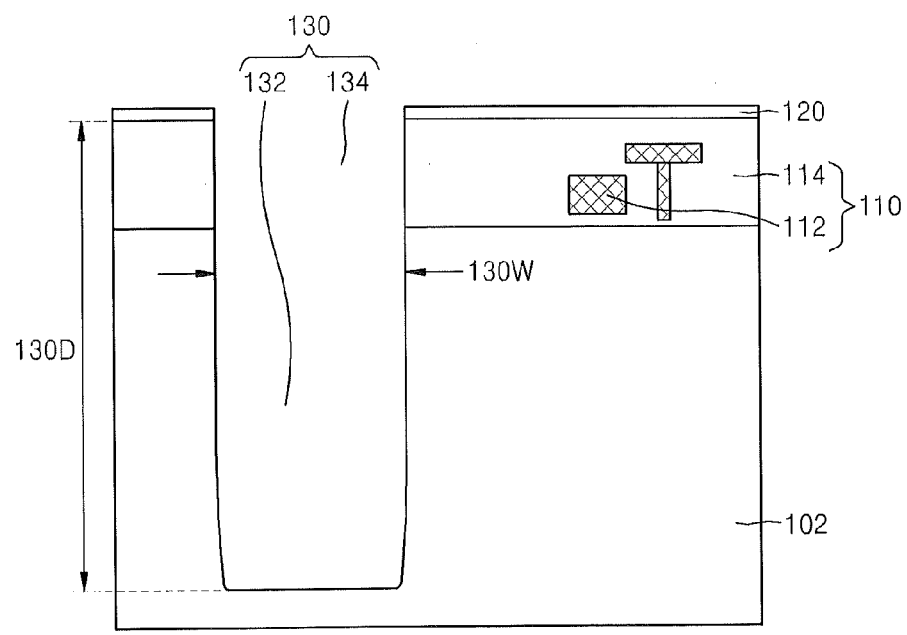
Figure 4C:
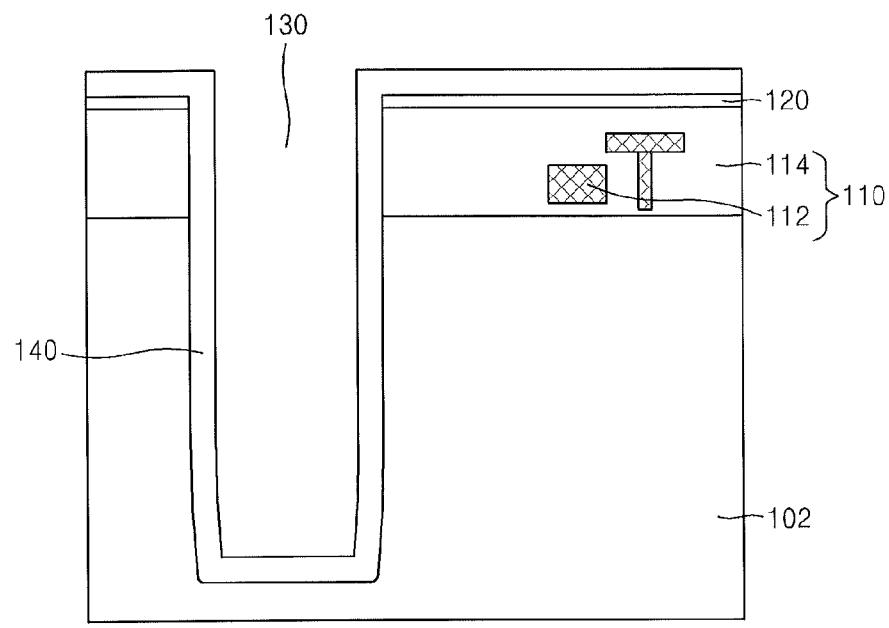
Figure 4D:
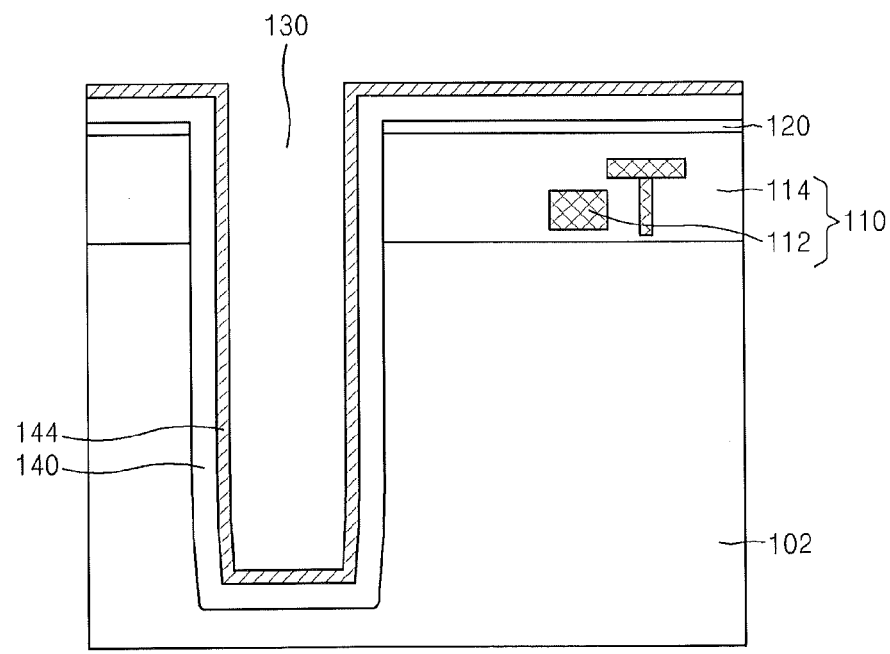
Figure 4E:
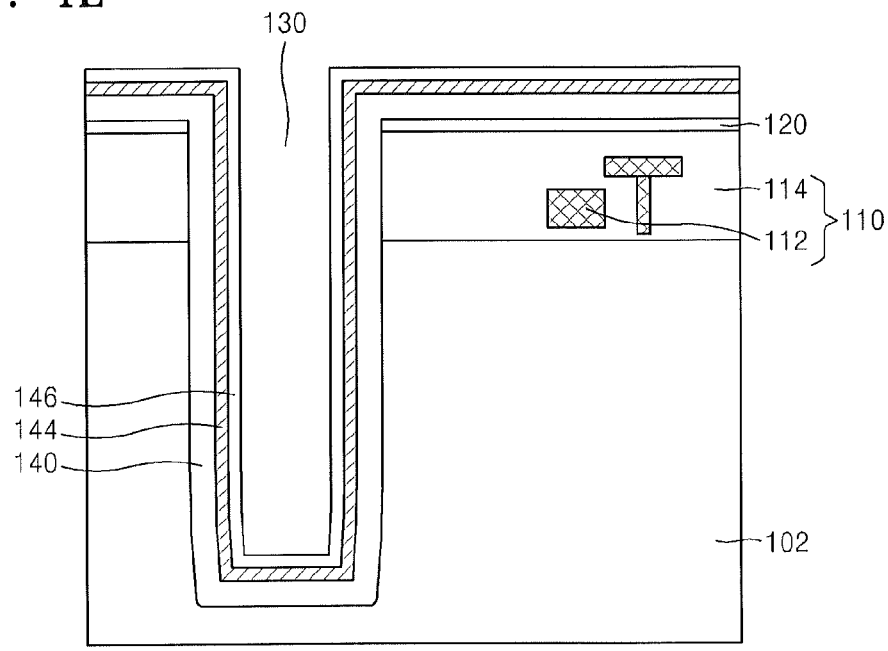
Figure 4F:
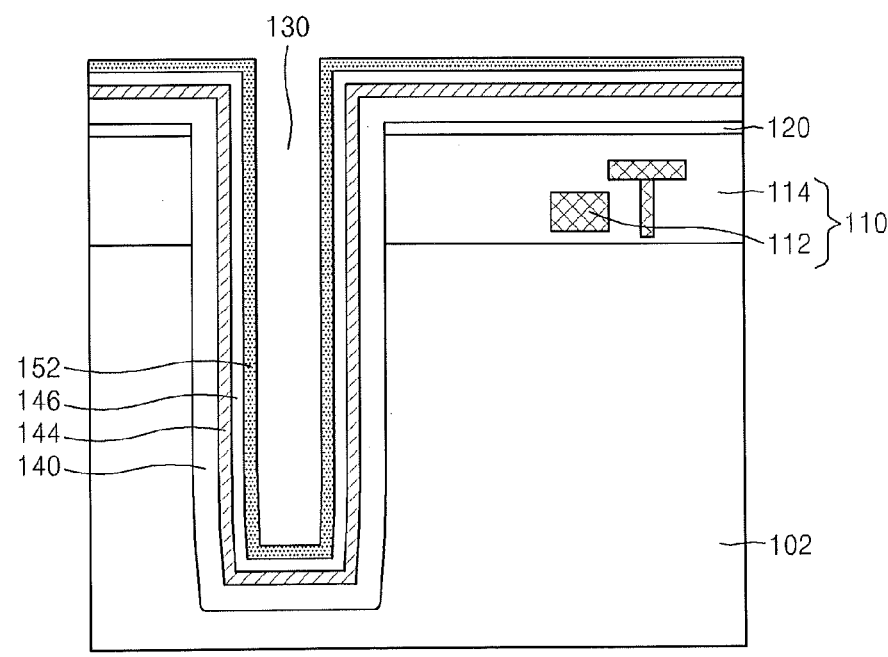
Figure 4G:
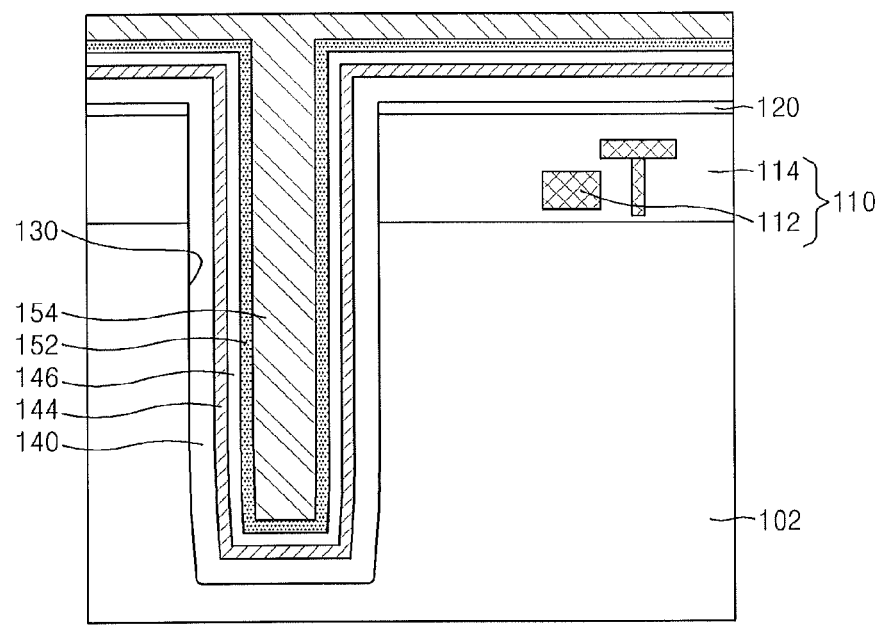
Figure 4H:
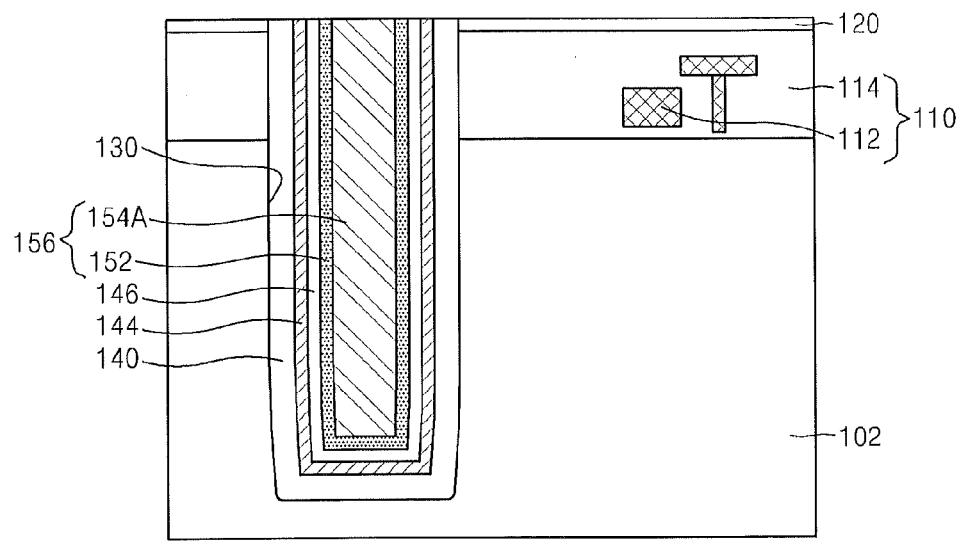
Figure 4I:
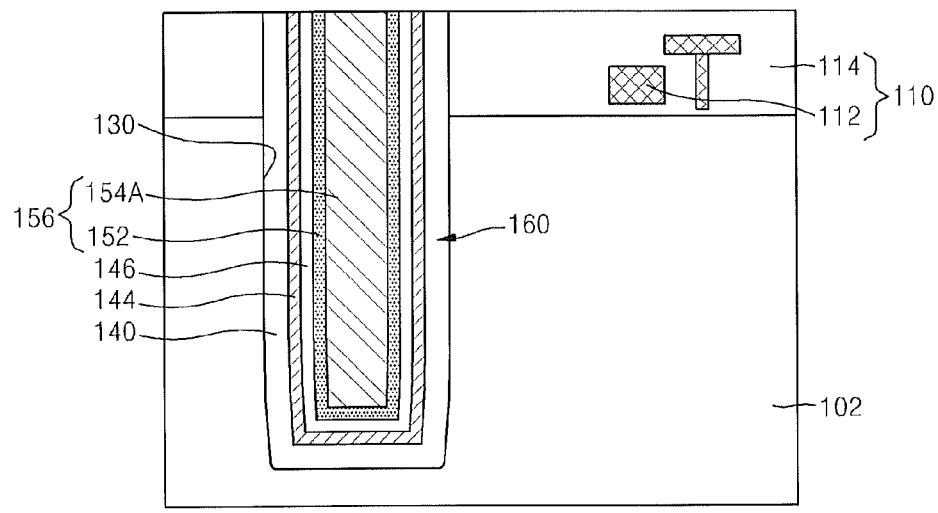
Figure 4J:
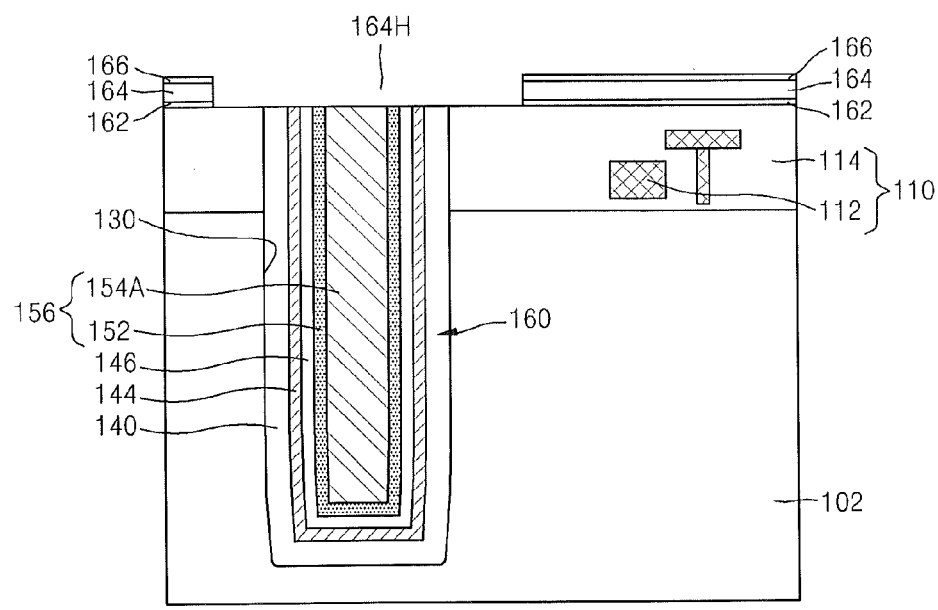
Figure 4K:
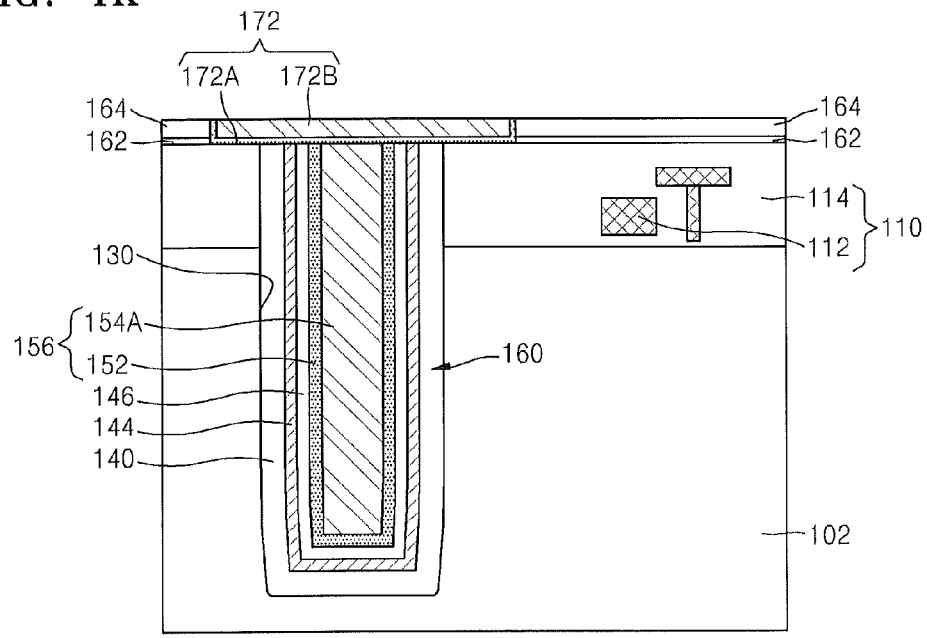
Figure 4L:
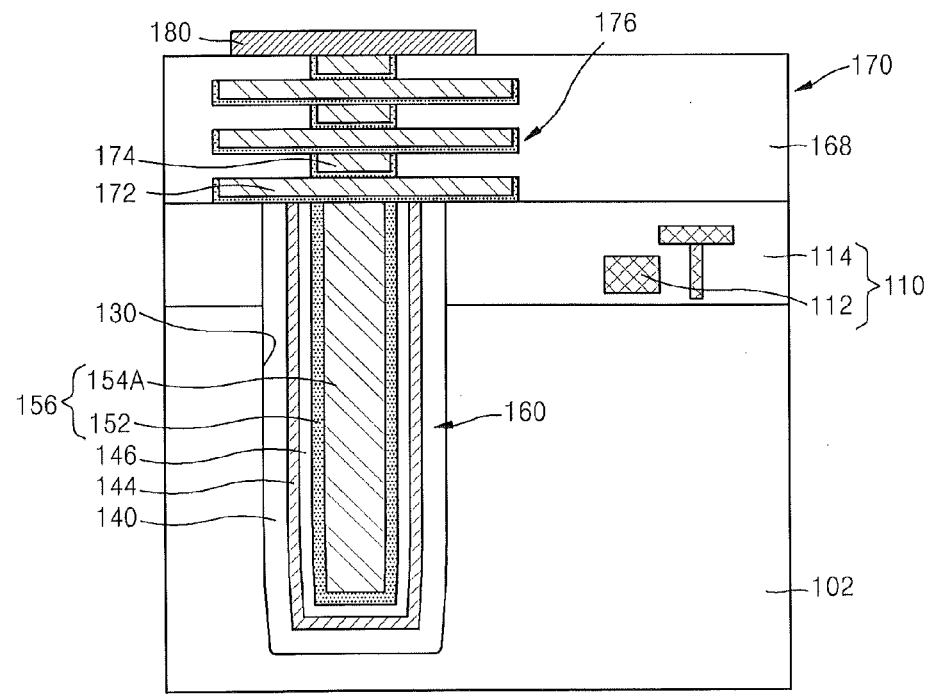
Figure 4M:
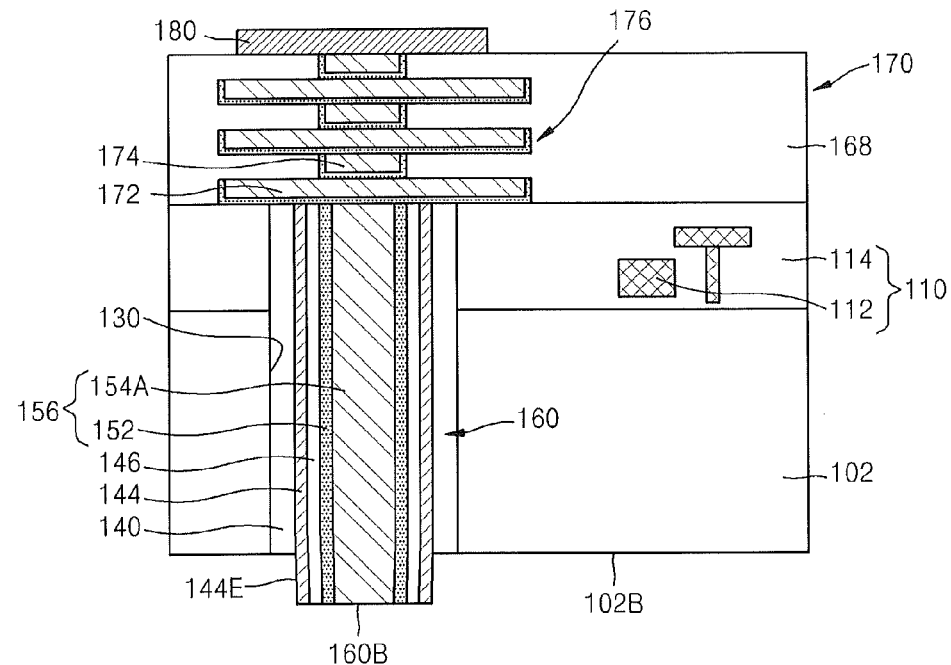
Figure 4N:
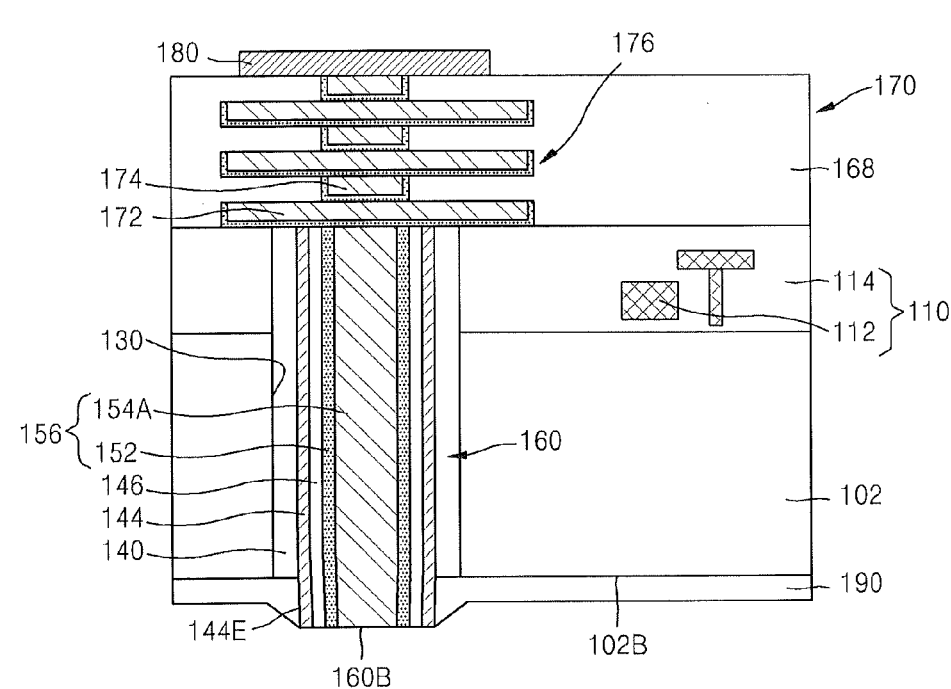

FIGS. 4A to 4N are cross-sectional views, which are sequentially illustrated according to a process sequence, illustrating a method of fabricating an integrated circuit device 100 (see FIG. 4N) according to some embodiments. Referring to FIG. 4A, a front-end-of-line (FEOL) structure 110 may be formed on a substrate 102, a first polishing stopper 120 may be formed on the FEOL structure 110, and, then, a mask pattern 122 may be formed on the first polishing stopper 120. The mask pattern 122 may have a hole 122H exposing a portion of a top surface of the first polishing stopper 120.

In some embodiments, the substrate 102 may be a semiconductor wafer. In at least one embodiment, the substrate 102 may comprise silicon (Si). In some embodiments, the substrate 102 may include a semiconductor element, such as germanium (Ge), or a compound semiconductor, such as silicon carbide (SiC), gallium arsenide (GaAs), indium arsenide (InAs), or indium phosphide (InP). In at least one embodiment, the substrate 102 may have a silicon on insulator (SOI) structure. For example, the substrate 102 may include a buried oxide (BOX) layer. In some embodiments, the substrate 102 may have a conductive region, for example, an impurity-doped well, or an impurity-doped structure. In addition, the substrate 102 may have various isolation structures, such as a shallow trench isolation (STI) structure.

The FEOL structure 110 may include a plurality of various individual devices 112 and an interlayer insulating film 114. The individual devices 112 may include various microelectronic devices, for example, a metal-oxide-semiconductor field (MOSFET) effect transistor, a large scale integration (LSI) system, an image sensor, such as a complementary metal-oxide-semiconductor (CMOS) imaging sensor (CIS), a micro-electro-mechanical system (MEMS), an active device, or a passive device. The individual devices 112 may be electrically connected to a conductive region of the substrate 102. In addition, the individual devices 112 may each be electrically separated from their neighboring individual devices by the interlayer insulating film 114.

In some embodiments, the first polishing stopper 120 may be composed of a silicon nitride film. The first polishing stopper 120 may be formed to have a thickness of about 200 to about 1000 Å. The first polishing stopper 120 may be formed by using a CVD process. Moreover, the mask pattern 122 may be formed of a photoresist material.

Referring to FIG. 4B, the first polishing stopper 120 and the interlayer insulating film 114 may be etched by using the mask pattern 122 (see FIG. 4A) as an etch mask, and, subsequently, the substrate 102 may be etched to form a via hole 130. The via hole 130 may include a first hole 132 with a predetermined depth in the substrate 102, and a second hole 134 that passes through the interlayer insulating film 114 to connect/communicate with the first hole 132.

The via hole 130 may be formed by anisotropic etching or laser drilling. In some embodiments, the via hole 130 may be formed to have a width 130W of about 10 micrometers (μm) or less in the substrate 102. In some embodiments, the via hole 130 may be formed to have a depth 130D of about 50 to about 100 μm from the top surface of the interlayer insulating film 114. However, the width and depth of the via hole 130 are not limited to these examples, and may be formed in various dimensions according to design purpose. The first hole 132 of the via hole 130 may expose the substrate 102, and the second hole 134 of the via hole 130 may expose the interlayer insulating film 114. After the formation of the via hole 130, the mask pattern 122 may be removed to expose the top surface of the first polishing stopper 120.

Referring to FIG. 4C, a via insulating film 140 covering an inner sidewall and a lower surface of the via hole 130 may be formed. The via insulating film 140 may be formed to have a relatively uniform thickness to cover the surface of the substrate 102, the surface of the interlayer insulating film 114, and the surface of the first polishing stopper 120, which surfaces are exposed in the via hole 130. In some embodiments, the insulating thin film 140 may be an oxide film, a nitride film, a carbide film, a polymer, or a combination thereof. In some embodiments, the via insulating film 140 may be formed by using a low temperature CVD process or a PECVD process. The via insulating film 140 may be formed to have a thickness of about 1500 to about 2500 Å.

Referring to FIG. 4D, a first conductive barrier film 144 is formed on the via insulating film 140 inside and outside the via hole 130. A portion of the first conductive barrier film 144 corresponding to the inside of the via hole 130 may have a cylindrically-shaped structure. In some embodiments, the first conductive barrier film 144 may be a conductive layer having a relatively low interconnection line resistance. For example, the first conductive barrier film 144 may be a single or multiple film including at least one selected from W, WN, Ti, TiN, Ta, TaN, and Ru. For example, the first conductive barrier film 144 may be a multiple film formed of TaN/W, TiN/W, or WN/W. The first conductive barrier film 144 may be formed to have a thickness of about 50 to about 1000 Å.

Referring still to FIG. 4D, the first conductive barrier film 144 may be formed to be relatively uniform, and to cover the inner sidewall of the via hole 130. To do this, the first conductive barrier film 144 may be formed by using an ALD process or a CVD process.

Referring to FIG. 4E, an insulating thin film 146 may be formed on the first conductive barrier film 144 inside and outside of the via hole 130. The insulating thin film 146 may be a high density thin film having a relatively uniform thickness covering the inner sidewall of the via hole 130. The insulating thin film may be formed by using an ALD process or a CVD process. The insulating thin film 146 may be formed to have a thickness of about 50 to about 1000 Å.

A portion of the insulating thin film 146 corresponding to the inside of the via hole 130 may have a cylindrically shaped structure. The insulating thin film 146 may be an oxide film, a nitride film, a metal oxide film, a high-dielectric-constant film, a polymer, or a combination thereof. A detailed description about a material that constitutes the insulating thin film 146 may be the same as that of the insulating thin film 36 described with reference to FIG. 1A.

Referring to FIG. 4F, a second conductive barrier film 152 may be formed on the insulating thin film 146 inside and outside the via hole 130. The second conductive barrier film 152 may be formed by using a PVD process or a CVD process.

The second conductive barrier film 152, like the second conductive barrier film 32B illustrated in FIG. 1A, may be formed to have a relatively uniform thickness in the lengthwise direction of the via hole 130. However, the second conductive barrier film 152 is not limited thereto. For example, in some embodiments, like the second conductive barrier film 62B illustrated in FIG. 1B, a thickness of the second conductive barrier film 152 may decrease from an inlet of the via hole 130 to a lower surface of the via hole 130. For example, a thickness of a portion of the second conductive barrier film 152 at the inlet of the via hole 130 inside the via hole 130 may be in a range of about 100 to about 1000 Å, and a thickness of a portion of the second conductive barrier film 152 in the vicinity of the lower surface of the via hole 130 may be in a range of about 0 to about 50 Å. The second conductive barrier film 152 having a variable thickness in the lengthwise direction of the via hole 130 may be formed by a PVD process.

The second conductive barrier film 152 may be a single film formed of one kind of material or a multiple film formed of at least two kinds of materials. In some embodiments, the second conductive barrier film 152 may include at least one material selected from W, WN, WC, Ti, TiN, Ta, TaN, Ru, Co, Mn, WN, Ni, and NiB.

Referring to FIG. 4G, a metal film 154 filling the remaining space of the via hole 130 may be formed on the second conductive barrier film 152. The metal film 154 may be formed to cover the second conductive barrier film 152 inside and outside of the via hole 130. In some embodiments, an electroplating process may be used to form the metal film 154. In particular, first, a metal seed layer may be formed on a surface of the second conductive barrier film 152, and, then, a metal film may be grown from the metal seed layer by electroplating to form a metal film 154 filling the via hole 130 on the second conductive barrier film 152. The metal seed layer may be formed of Cu, a Cu alloy, Co, Ni, Ru, Co/Cu, or Ru/Cu. The metal seed layer may be formed by using a PVD process. The metal film 154 may be mainly formed of Cu or W. In some embodiments, the metal film 154 may be formed of Cu, CuSn, CuMg, CuNi, CuZn, CuPd, CuAu, CuRe, CuW, W, or a W alloy, but a material for forming the metal film 154 may not be limited thereto. The electroplating may be performed at a temperature of about 10 to about 65° C. For example, the electroplating may be performed at room temperature. When the metal film 154 is formed, the resultant structure including the metal film 154 may be annealed at a temperature of about 150 to about 450° C.

Referring to FIG. 4H, the resultant structure of FIG. 4G including the metal film 154 may be polished by using the first polishing stopper 120 as a stopper while performing chemical mechanical polishing (CMP) to expose the first polishing stopper 120. As a result, portions of the via insulating film 140, the first conductive barrier film 144, the insulating thin film 146, the second conductive barrier film 152, and the metal film 154 corresponding to the outside of the via hole 130 may be removed. Moreover, inside the via hole 130, a metal plug 154A, that is, a portion of the conductive film 154, may remain on the second conductive barrier film 152. The second conductive barrier film 152 and a conductive plug 156 including the metal plug 154A may be spaced apart from the first conductive barrier film 144 with the insulating thin film 146 interposed therebetween in the via hole 130.

Referring to FIG. 4I, the resultant structure including the metal plug 154A in the via hole 130 may be heat treated. As a result, metal particles that constitute the metal plug 154A may grow due to the heat treatment, so that roughness may deteriorate the exposed surface of the metal plug 154A. Some of the heat-treatment-induced grown metal particles protruding from the via hole 130 may be removed by CMP. In this regard, the first polishing stopper 120 (see FIG. 4H) may also be removed to expose a top surface of the interlayer insulating film 114 of the FEOL structure 110. The heat treatment may be performed at a temperature of about 400 to about 500° C. Moreover, a TSV structure 160 including the first conductive barrier film 144, the insulating thin film 146, and the conductive plug 156 may remain in the via hole 130.

Referring to FIG. 4J, after the resultant structure including the TSV structure 160 illustrated in FIG. 4I is washed, a second polishing stopper 162, a metal interlayer insulating film 164, and a third polishing stopper 166 may be sequentially formed on the interlayer insulating film 114, and then patterned to form a hole 164H for a metal interconnection line, the hole 164H exposing the top surface of the TSV structure 160 and an area surrounding the TSV structure 160 at the inlet of the via hole 130. When the hole 164H for a metal interconnection line is formed, the second polishing stopper 162 may be used as an etch stopper.

The hole 164H for a metal interconnection line may expose a portion of the TSV structure 160, a portion of the via insulating film 140 surrounding the outer sidewall of the TSV structure 160, and a portion of the interlayer insulating film 114. Alternatively, the hole 164H for a metal interconnection line may be formed in such a way that the hole 164H for a metal interconnection line exposes only the top surface of the TSV structure 160.

In some embodiments, the metal interlayer insulating film 164 may be formed of tetra-ethyl-ortho-silicate (TEOS). The second polishing stopper 162 and the third polishing stopper 166 may each be formed of a silicon oxynitride film. Thicknesses of the second polishing stopper 162, the metal interlayer insulating film 164, and the third polishing stopper 166 may vary according to design purpose.

Referring to FIG. 4K, a metal interconnection line layer 172 may be formed in the hole 164H of the metal interconnection line. The metal interconnection line layer 172 may have a stacked structure including a barrier film 172A for an interconnection line and a metal layer 172B for an interconnection line.

In some embodiments, the metal interconnection line layer 172 may be formed as follows: a first film for forming the barrier film 172A for the interconnection line, and a second film for forming the metal layer 172B for an interconnection line may be sequentially formed in the hole 164H for a metal interconnection line and on the third polishing stopper 166 (see FIG. 4J), the resultant structure including the first film and the second film may be polished by performing CMP with the third polishing stopper 166 acting as a stopper, and the third polishing stopper 166 may be removed to expose the top surface of the metal interlayer insulating film 164. As a result, the barrier film 172A for an interconnection line and the metal layer 172B for an interconnection line may remain in the hole 164H for the metal interconnection line.

In some embodiments, the barrier film 172A for an interconnection line may include at least one material selected from Ti, TiN, Ta, and TaN. In some embodiments, the barrier film 172A for an interconnection line may be formed by using a PVD process. The barrier film 172A for an interconnection line may be formed to have a thickness of about 1000 to about 1500 Å.

In some embodiments, the metal layer 172B for an interconnection line may include Cu. The metal layer 172B for an interconnection line may be formed as follows: a Cu seed layer may be formed on the barrier film 172A for an interconnection line, a Cu layer may then be grown from the Cu seed layer by electroplating, and the resultant structure including the Cu layer may be annealed.

Referring to FIG. 4L, like the process for forming the metal interconnection line layer 172 described with reference to FIGS. 4J and 4K, a contact plug 174 having the same stacked structure as the metal interconnection line layer 172 may be formed on the metal interconnection line layer 172. Thereafter, the process for forming the metal interconnection line layer 172 described with reference to FIGS. 4J and 4K and the process for forming the contact plug 174 may be alternately and repeatedly performed to form a multi-layer interconnection line pattern 176 for a through-hole electrode in which a plurality of metal interconnection line layers 172 and a plurality of contact plugs 174 are alternately connected to each other.

In some embodiments, when the multi-layer interconnection line pattern 176 is formed, even on other regions of the substrate 102, other multi-layer interconnection line patterns including a metal interconnection line layer and a contact plug that are simultaneously formed with at least a portion of the metal interconnection line layers 172 and the contact plugs 174 may be formed. As a result, a back-end-of-line (BEOL) structure 170 including a metal interlayer insulating film structure 168 including the second polishing stoppers 162 and the metal interlayer insulating films 164, and a plurality of multi-layer interconnection line patterns including a portion insulated by the metal interlayer insulating film structure 168 may be formed on the FEOL structure 110. The BEOL structure 170 may include a plurality of interconnection line structures for the connection between individual devices included in the FEOL structure 110 and other interconnection lines formed on the substrate 102. In some embodiments, the BEOL structure 170 may further include the interconnection line structures and a seal ring for the protection of other structures disposed thereunder from external impacts or moisture.

A contact pad 180 electrically connected to the multi-layer interconnection line pattern 176 may be formed on the metal interlayer insulating film structure 168. The metal interlayer insulating film structure 168 may separate the metal interconnection line layers 172 from each other. The metal interconnection line layers 172 and the contact plugs 174 may be electrically separated from other neighboring interconnection lines by the metal interlayer insulating film structure 168.

In FIG. 4L, the illustrated multi-layer interconnection line pattern 176 includes three metal interconnection line layers 172 and three contact plugs 174. However, the structure of multi-layer interconnection line pattern 176 illustrated in FIG. 4L is only an example, and the present disclosure is not limited thereto. In addition, the connection structure between the metal interconnection line layer 172 and the contact plug 174 in the multi-layer interconnection line pattern 176 illustrated in FIG. 4L is only an example, and the present disclosure is not limited thereto.

In some embodiments, the metal interconnection line layer 172 and the contact plugs 174 may each include at least one metal selected from W, Aluminum (Al), and Cu. In some embodiments, the metal interconnection line layers 172 and the contact plugs 174 may be formed of an identical material. In other embodiments, at least a portion of the metal interconnection line layers 172 and contact plugs 174 may be formed of different materials.

In some embodiments, in the metal interlayer insulating film structure 168, other multi-layer interconnection line patterns may be formed at the same level as the multi-layer interconnection line pattern 176. In addition, a plurality of other contact pads may be formed at the same level as the contact pad 180 on the metal interlayer insulating film 164.

Referring to FIG. 4M, a portion of the substrate 102 may be removed from its lower surface to expose a lower surface 160B of the TSV structure 160. The lower surface 160B of the TSV structure 160 may expose a portion of the first conductive barrier film 144 and a portion of the conductive plug 156. As illustrated in FIG. 4M, a portion of the substrate 102 may be removed such that the lower surface 160B of the TSV structure 160 protrudes from a lower surface 102B of the substrate 102. In some embodiments, to remove a portion of the substrate 102 from its lower surface, a CMP process, an etch back process, or a combination thereof may be used.

Due to the removal of the portion of the substrate 102 from the lower surface, the via hole 130 may become a through-hole passing through the substrate 102 and the interlayer insulating film 114. A portion of the via insulating film 140 and a portion of the TSV structure 160 may protrude from the lower surface 102B of the substrate 102. After the lower surface 160B of the TSV structure 160 is exposed, a portion of the via insulating film 140 surrounding the TSV structure 160 in the vicinity of the portion of the TSV structure 160 protruding from the lower surface 102B of the substrate 102 may be removed by isotropic etching or anisotropic etching to expose a sidewall 144E of the first conductive barrier film 144.

Referring to FIG. 4N, a backside insulating film 190 covering the lower surface 102B of the substrate 102 in the vicinity of the lower surface 160B of the TSV structure 160 may formed, thereby completing the fabrication of the integrated circuit device 100. In some embodiments, the backside insulating film 190 may be formed by a spin coating process or a spray process. The backside insulating film 190 may be formed of a polymer. In some embodiments, the backside insulating film 190 may be formed as follows: a polymer film covering the lower surface 102B of the substrate 102 and the lower surface 160B of the TSV structure 160 may be formed, and, then, a portion of the polymer film may be etched back to expose the lower surface 160B of the TSV structure 160.

The TSV structure 160 of the semiconductor device 100 of FIG. 4N may have a sidewall portion surrounded by the substrate 102, and a sidewall portion surrounded by the interlayer insulating film 114 of the FEOL structure 110. The substrate 102 and the FEOL structure 110 may correspond to the semiconductor structure 20 illustrated in FIG. 1A, and the TSV structure 160 may correspond to the TSV structure 30A illustrated in FIG. 1A. A conductive layer may be connected to the lower surface 160B of the TSV structure 160. In some embodiments, the conductive layer may correspond to the first conductive layer 52 or the second conductive layer 54 illustrated in FIGS. 1A and 1B.

The second conductive barrier film 152 of the semiconductor device 100 of FIG. 4N may have a relatively uniform thickness along the lengthwise direction of the via hole 130. However, as long as it does not depart from the scope of the present disclosure, the second conductive barrier film 152 may instead have a variable thickness along the lengthwise direction of the via hole 130.

Figure 5:
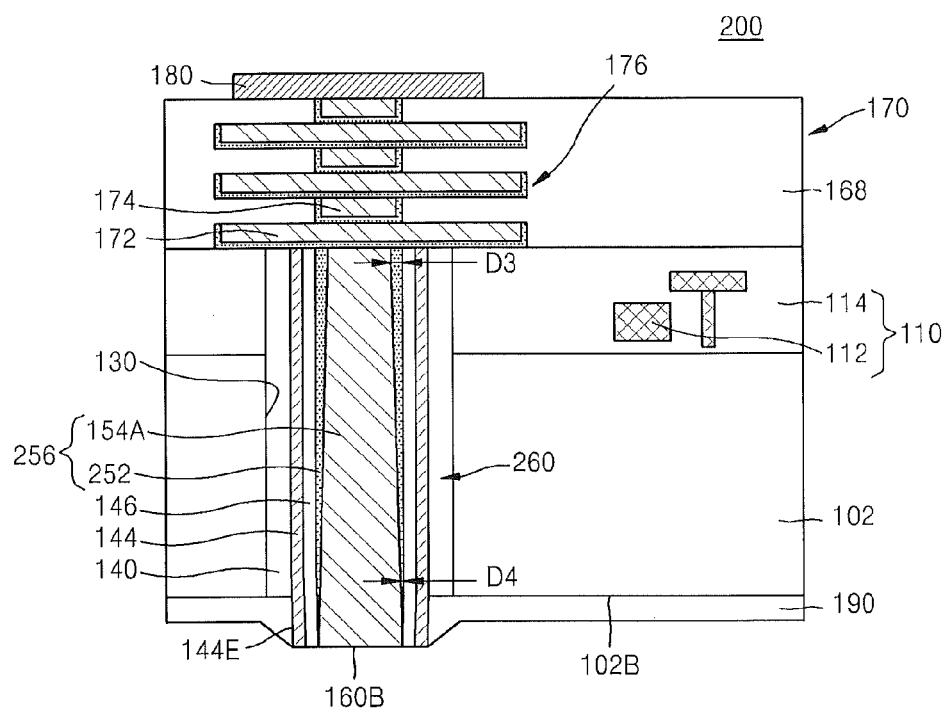
FIGS. 5-9 are cross-sectional views illustrating integrated circuit devices according to some embodiments.

FIG. 5 is a cross-sectional view illustrating major elements of an integrated circuit device 200 according to some embodiments. The same reference numerals of FIG. 5 and FIGS. 4A to 4N denote the same elements, and, accordingly, repeated detailed descriptions thereof may be omitted. A TSV structure 260 of the integrated circuit device 200 may be the same as in the TSV structure 160 illustrated in FIG. 4N, except that in the via hole 130, a second conductive barrier film 252 of a conductive plug 256 has a thickness D3 in the vicinity of the top surface of the interlayer insulating film 114 and a thickness D4 in the vicinity of the lower surface 102B of the substrate 102, wherein the thickness D4 is smaller than the thickness D3.

Figure 6:
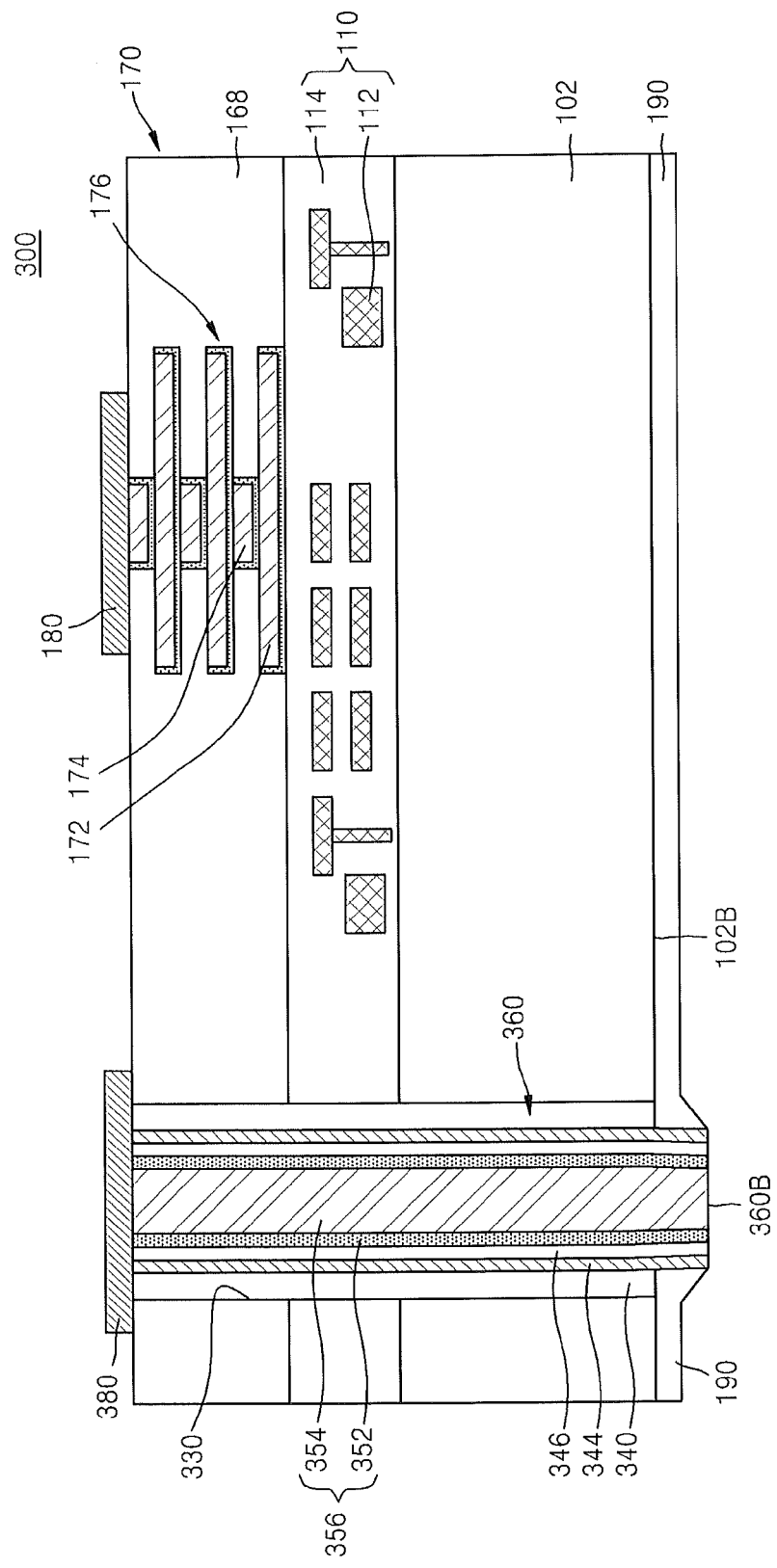

FIG. 6 is a cross-sectional view illustrating major elements of an integrated circuit device 300 according to some embodiments. The same reference numerals of FIG. 6 and FIGS. 4A to 4N denote the same elements, and, accordingly, repeated detailed descriptions thereof may be omitted. Referring to FIG. 6, a TSV structure 360 of the integrated circuit device 300 may pass through the substrate 102, the interlayer insulating film 114 of the FEOL structure 110, and the metal interlayer insulating film structure 168 of the BEOL structure 170, while a sidewall of the TSV structure 360 may be surrounded by a via insulating film 340.

The TSV structure 360 may include a conductive plug 356, a first conductive barrier film 344 that is spaced apart from the conductive plug 356 and surrounds the conductive plug 356, and an insulating thin film 346 interposed between the conductive plug 356 and the first conductive barrier film 344.

The conductive plug 356 may include a second conductive barrier film 352 passing through the substrate 102, the interlayer insulating film 114 of the FEOL structure 110, the metal interlayer insulating film structure 168 of the BEOL structure 170, and a metal plug 354 surrounded by the second conductive barrier film 352. The conductive plug 356 may be spaced apart from the first conductive barrier film 344 with the insulating thin film 346 therebetween. In some embodiments, the second conductive barrier film 352 may be omitted.

The TSV structure 360 may include a portion surrounded by the substrate 102, a portion surrounded by the interlayer insulating film 114 of the FEOL structure 110, and a portion surrounded by the metal interlayer insulating film structure 168 of the BEOL structure 170.

The TSV structure 360 may be formed by the following series of processes. First, the FEOL structure 110 may be formed in the same manner as described with reference to FIG. 4A, and, then, the BEOL structure 170 including the multi-layer interconnection line pattern 176 and the metal interlayer insulating film structure 168 may be formed in the same manner as described with reference to FIGS. 4J to 4L. Thereafter, the metal interlayer insulating film structure 168, the interlayer insulating film 114, and the substrate 102 may be sequentially etched to form a via hole 330, and the via insulating film 340 and the TSV structure 360 may be formed in the via hole 330 in the same manner as the process for forming the via insulating film 140 and the TSV structure 160 described with reference to FIGS. 4A to 4I. Subsequently, the contact pad 180 that is electrically connectable to the multi-layer interconnection line pattern 176, and the contact pad 380 that is electrically connectable to the TSV structure 360 may be formed. A portion of the first conductive barrier film 344 of the TSV structure 360 and a portion of the conductive plug 356 may contact the contact pad 380.

Thereafter, in the same manner as described with reference to FIGS. 4M and 4N, a lower surface 360B of the TSV structure 360 may be exposed, and, then, a backside insulating film 190 covering the lower surface 102B of the substrate 102 may be formed to complete the fabrication of the integrated circuit device 300. Moreover, it will be understood that a detailed description of the TSV structure 360 may be the same as that of the TSV structure 160 described with reference to FIGS. 4A to 4N.

The second conductive barrier film 352 of the semiconductor device 300 of FIG. 6 may have a relatively uniform thickness along the lengthwise direction of the via hole 330. However, as long as it does not depart from the scope of the present disclosure, the second conductive barrier film 352 may instead have a variable thickness along the lengthwise direction of the via hole 330.

Figure 7:
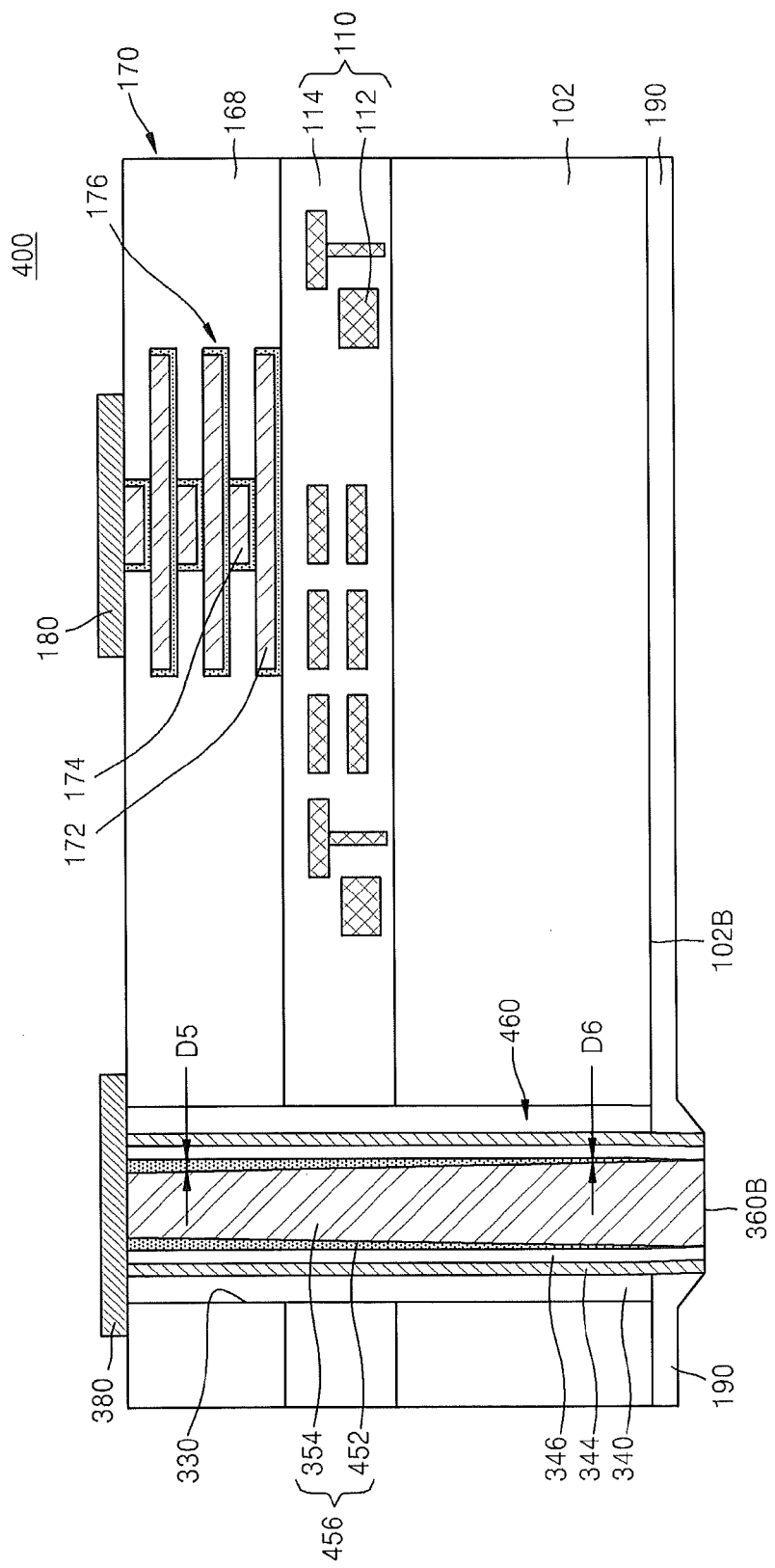

FIG. 7 is a cross-sectional view illustrating major elements of an integrated circuit device 400 according to some embodiments. The same reference numerals of FIG. 7 and FIGS. 4A to 4N and 6 denote the same elements, and, accordingly, repeated detailed descriptions thereof may be omitted.

A TSV structure 460 of the integrated circuit device 400 may be the same as in the TSV structure 360 of the integrated circuit device 300 illustrated in FIG. 6, except that in the via hole 330, a second conductive barrier film 452 of a conductive plug 456 may have a thickness D5 in the vicinity of the top surface of the interlayer insulating film 168 of the BEOL structure 170 and a thickness D6 in the vicinity of the lower surface 102B of the substrate 102, wherein the thickness D6 is smaller than the thickness D5.

Figure 8:
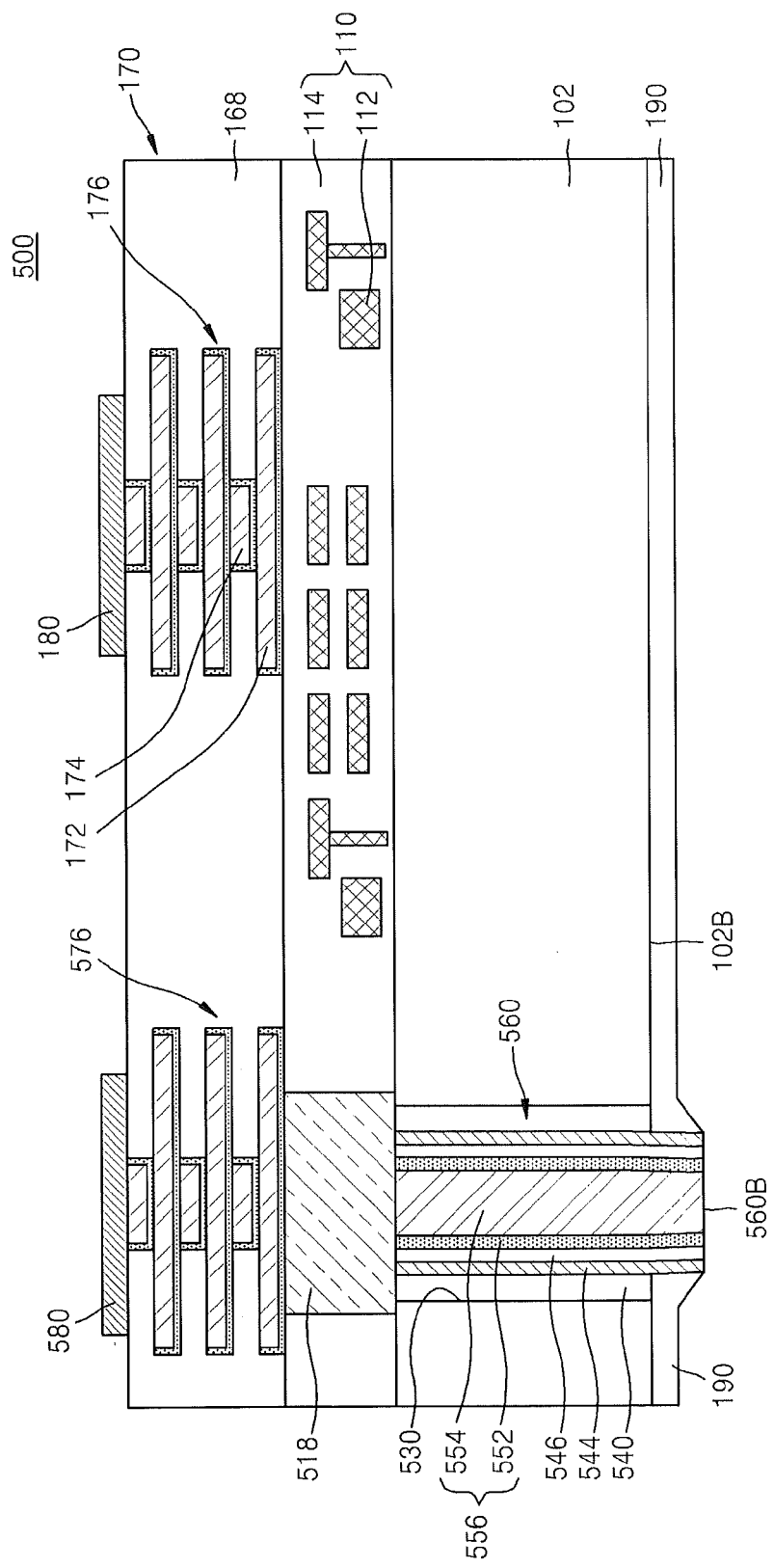

FIG. 8 is a cross-sectional view illustrating major elements of an integrated circuit device 500 according to some embodiments. The same reference numerals of FIG. 8 and FIGS. 4A to 4N denote the same elements, and, accordingly, repeated detailed descriptions thereof may be omitted.

Referring to FIG. 8, a TSV structure 560 of the integrated circuit device 500 passes through the substrate 102 while a sidewall of the TSV structure 560 is surrounded by the via insulating film 340. The TSV structure 560 may be formed at a lower level than the FEOL structure 110. The TSV structure 560 may include a conductive plug 556, a first conductive barrier film 544 that is spaced apart from the conductive plug 556 and surrounds the conductive plug 556, and an insulating thin film 546 interposed between the conductive plug 556 and the first conductive barrier film 544.

The conductive plug 556 may include a second conductive barrier film 552 passing through the substrate 102, and a metal plug 554 surrounded by the second conductive barrier film 552. The conductive plug 556 may be spaced apart from the first conductive barrier film 544 with the insulating thin film 546 therebetween. In some embodiments, the second conductive barrier film 552 may be omitted. The TSV structure 560 may have a sidewall surrounded by the substrate 102.

The TSV structure 560 may be formed by a series of processes as follows. First, before the FEOL structure 110 is formed on the substrate 102, a via hole 530 may be formed in the substrate 102, and, in a manner similar to that described with reference to FIGS. 4A to 4I, a via insulating film 540 and the TSV structure 560 surrounded by the via insulating film 540 may be formed in the via hole 530.

The FEOL structure 110 described with reference to FIG. 4A may be formed on the substrate 102 with the TSV structure 560. The FEOL structure 110 may further include an interconnection line structure 518 that is electrically connectable to the TSV structure 560. A portion of the first conductive barrier film 544 of the TSV structure 560 and a portion of the conductive plug 556 may contact the interconnection line structure 518. The interconnection line structure 518 may have a multi-layer interconnection line structure including a plurality of conductive layers and a plurality of contact plugs. However, the detailed shape of the interconnection line structure 518 is not limited thereto, and the interconnection line structure 518 may have various interconnection line structures as long as they do not depart from the scope of the present disclosure.

Thereafter, in the same manner as described with reference to FIGS. 4J to 4L, the BEOL structure 170 including the multi-layer interconnection line pattern 176 and the metal interlayer insulating film structure 168 may be formed. Referring to FIG. 8, the BEOL structure 170 may further include a multi-layer interconnection line pattern 576 that is electrically connectable to the TSV structure 560 through the interconnection line structure 518. Thereafter, the contact pads 180 and 580 electrically connectable to the multi-layer interconnection line patterns 176 and 576, respectively, may be formed on the metal interlayer insulating film structure 168.

Thereafter, in the same manner as described with reference to FIGS. 4M and 4N, a lower surface 560B of the TSV structure 560 may be exposed, and, then, a backside insulating film 190 covering the lower surface 102B of the substrate 102 may be formed to complete the fabrication of the integrated circuit device 500. Moreover, a detailed description of the TSV structure 560 may be the same as that of the TSV structure 160 described with reference to FIGS. 4A to 4N.

The second conductive barrier film 552 of the semiconductor device 500 of FIG. 8 may have a relatively uniform thickness along the lengthwise direction of the via hole 530. However, as long as it does not depart from the scope of the present disclosure, the second conductive barrier film 552 may instead have a variable thickness along the lengthwise direction of the via hole 530.

Figure 9:
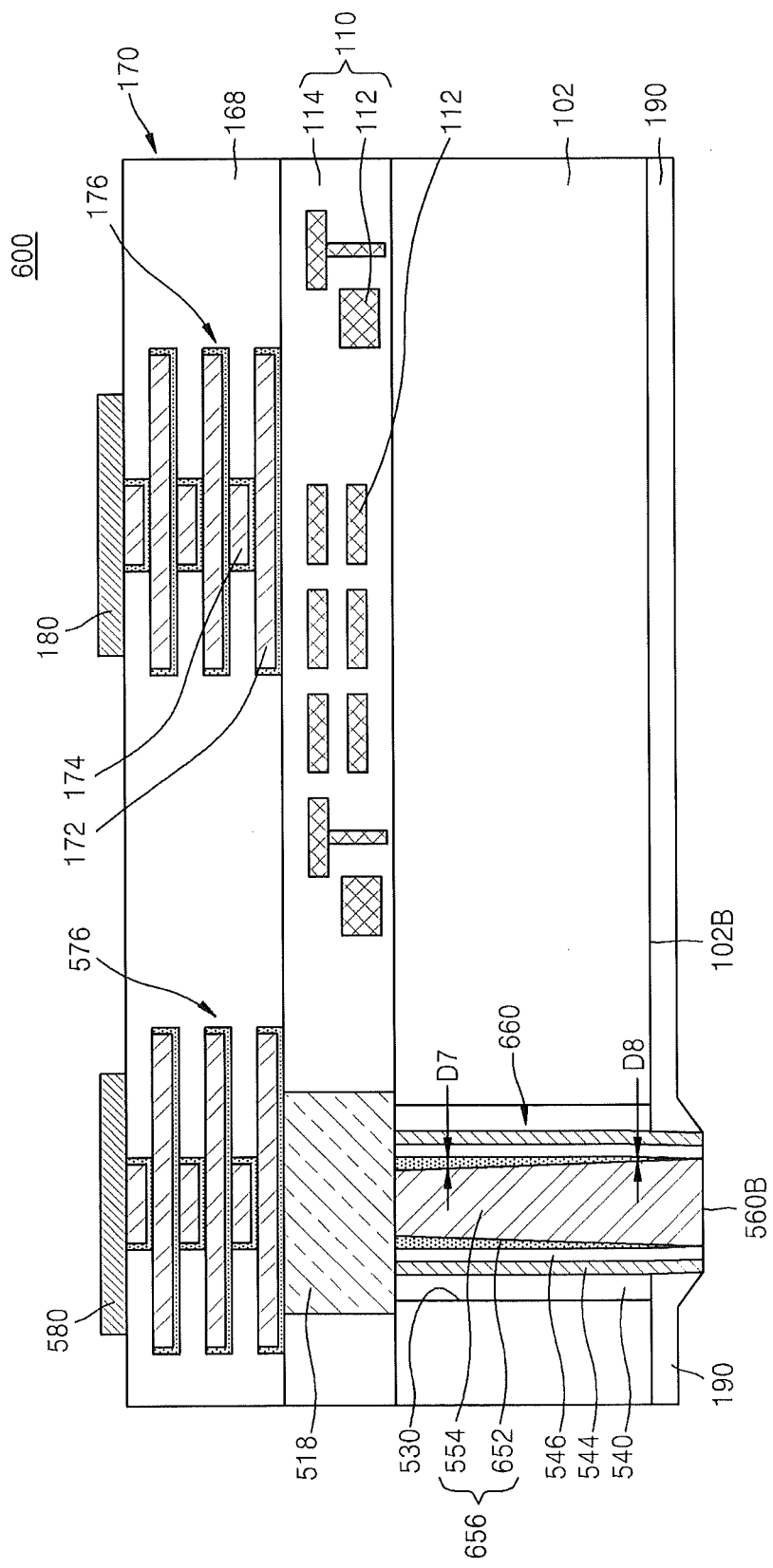

FIG. 9 is a cross-sectional view illustrating major elements of an integrated circuit device 600 according to some embodiments. The same reference numerals of FIG. 9 and FIGS. 4A to 4N and 8 denote the same elements, and, accordingly, repeated detailed descriptions thereof may be omitted.

A TSV structure 660 of the integrated circuit device 600 may be the same as in the TSV structure 560 of the integrated circuit device 500 illustrated in FIG. 8, except that in the via hole 530, a second conductive barrier film 652 of a conductive plug 656 may have a thickness D7 in the vicinity of the top surface of the substrate 102 and a thickness D8 in the vicinity of the lower surface 102B of the substrate 102, wherein the thickness D8 may be smaller than the thickness D7.

FIGS. 10A to 10K are cross-sectional views illustrating a method of fabricating an integrated circuit device 700 (see FIG. 10K) according to some embodiments. The same reference numerals of FIGS. 10A to 10K and 4A to 4N denote the same elements, and, accordingly, repeated detailed descriptions thereof may be omitted.

Figure 10A:
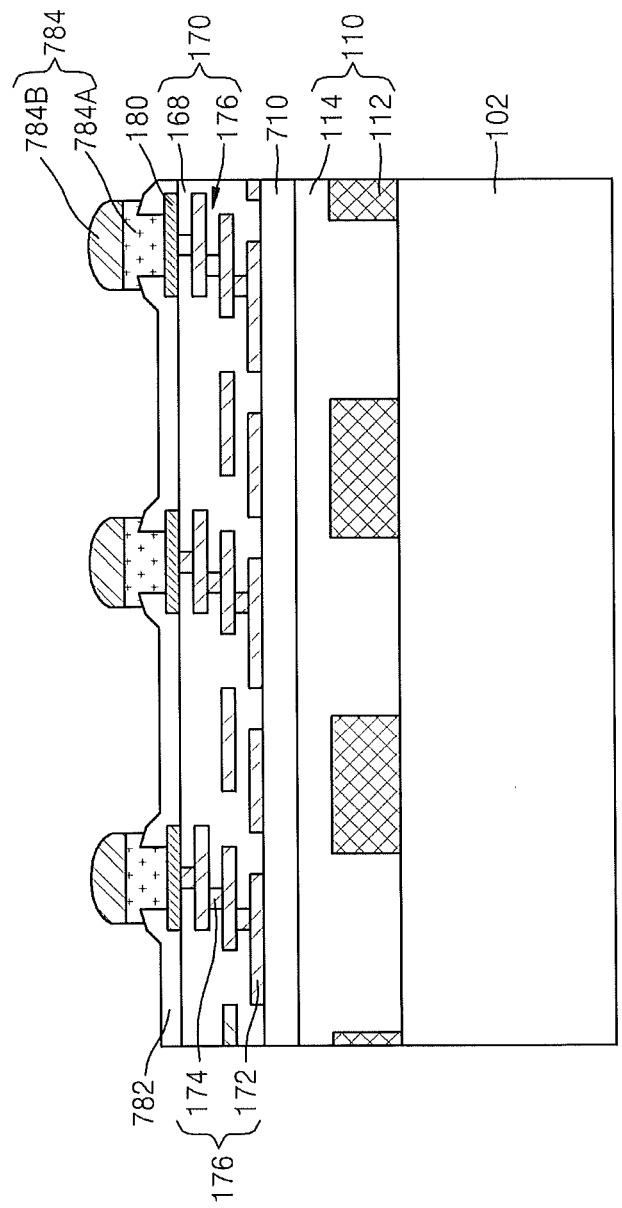
FIGS. 10A to 10K are cross-sectional views illustrating a method of fabricating an integrated circuit device according to some embodiments.

Referring to FIG. 10A, the FEOL structure 110 including the individual devices 112 and the interlayer insulating film 114 may be formed on the substrate 102, an etch stopping layer 710 may be formed on the FEOL structure 110, and the BEOL structure 170 may be formed on the etch stopping layer 710. The BEOL structure 170 may include the metal interlayer insulating film structure 168 and a plurality of multi-layer interconnection line patterns 176. The multi-layer interconnection line patterns 176 may each be composed of a plurality of metal interconnection line layers 172 and a plurality of contact plugs 174.

A plurality of contact pads 180 may be formed on the metal interlayer insulating film structure 168, and a passivation layer 782 and a plurality of bumps 784 may be formed on the BEOL structure 170. In FIG. 10A, the bumps 784 may each include a stacked structure including a first metal layer 784A and a second metal layer 784B. However, the present disclosure is not limited thereto, and the bumps 784 may instead have various other structures.

Figure 10B:
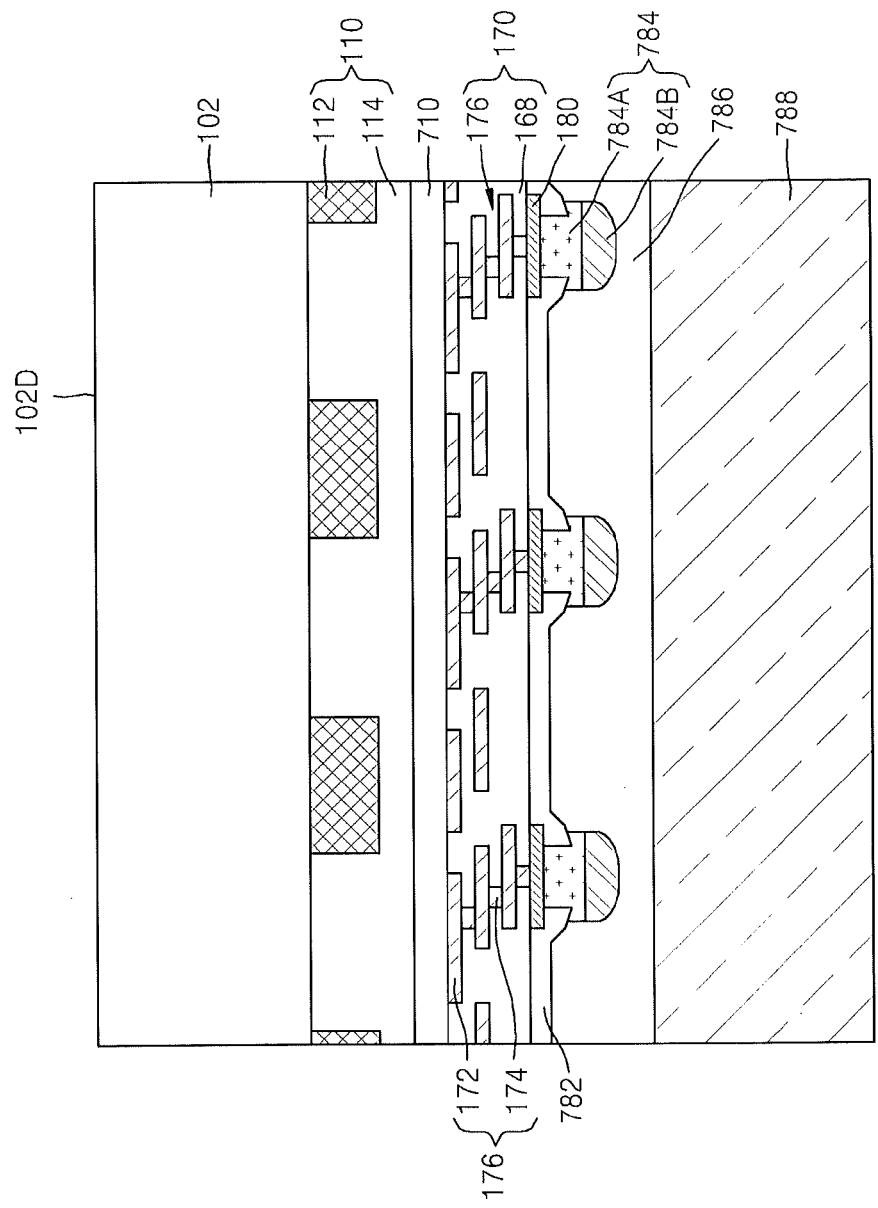

Referring to FIG. 10B, an adhesive coating layer 786 may be applied on a surface of the resultant structure where the bumps 784 are located, and the adhesive coating layer 786 may be used as an adhesive material to mount the substrate 102 with the bumps 784 on a wafer support substrate 788. Alternatively, to obtain the structure illustrated in FIG. 10B, the substrate 102 with the bumps 784 may be attached to the wafer support substrate 788 attached with the adhesive coating layer 786. Moreover, a side of the substrate 102 opposite the wafer support substrate 788 (e.g., a backside 102D of the substrate 102) may be exposed to the outside.

Figure 10C:
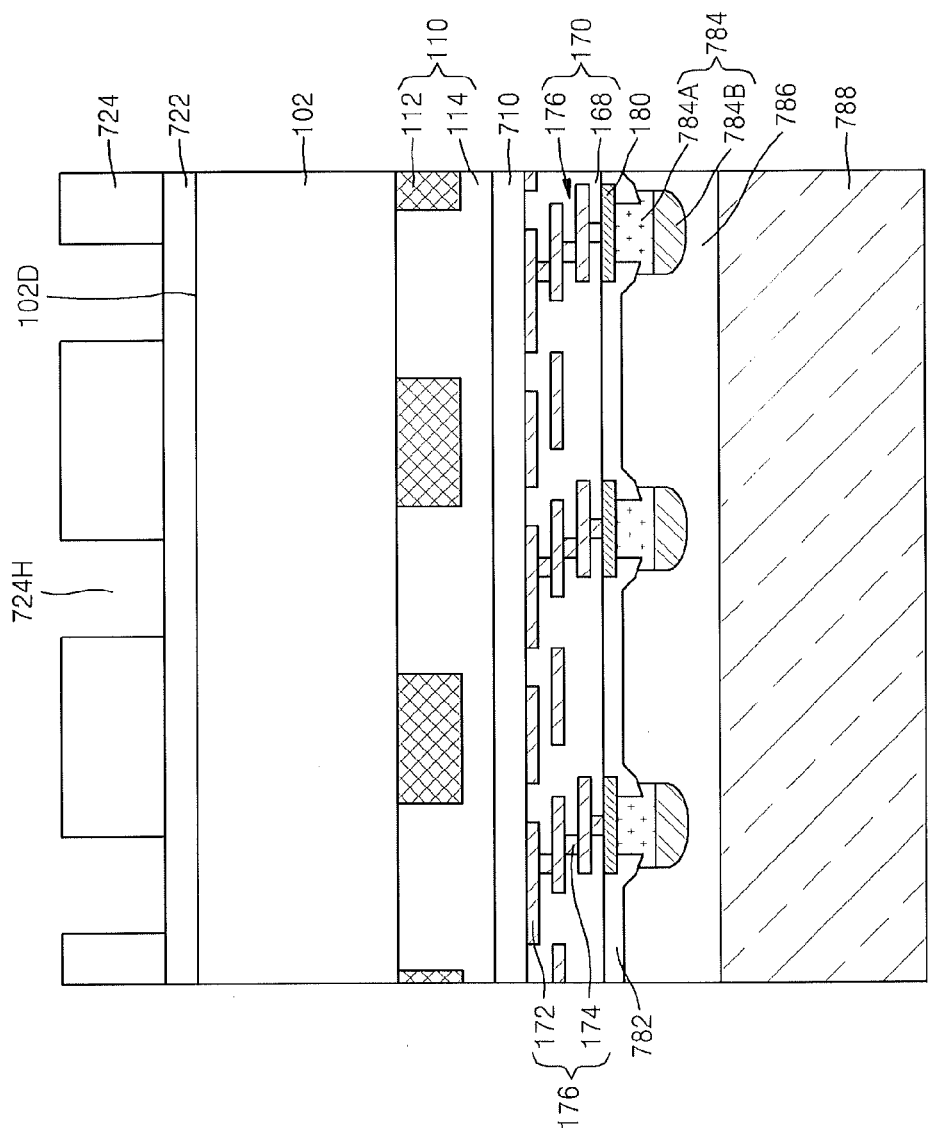

Referring to FIG. 10C, a hard mask layer 722 may be formed on the backside 102D of the substrate 102, and, then, a mask pattern 724 may be formed on the hard mask layer 722. In some embodiments, the hard mask layer 722 may be composed of a silicon nitride film. The hard mask layer 722 may have a thickness of about 200 to about 1000 Å. The mask pattern 724 may have a plurality of holes 724H exposing a portion of a top surface of the hard mask layer 722. In some embodiments, the mask pattern 724 may be composed of a photoresist material.

Figure 10D:
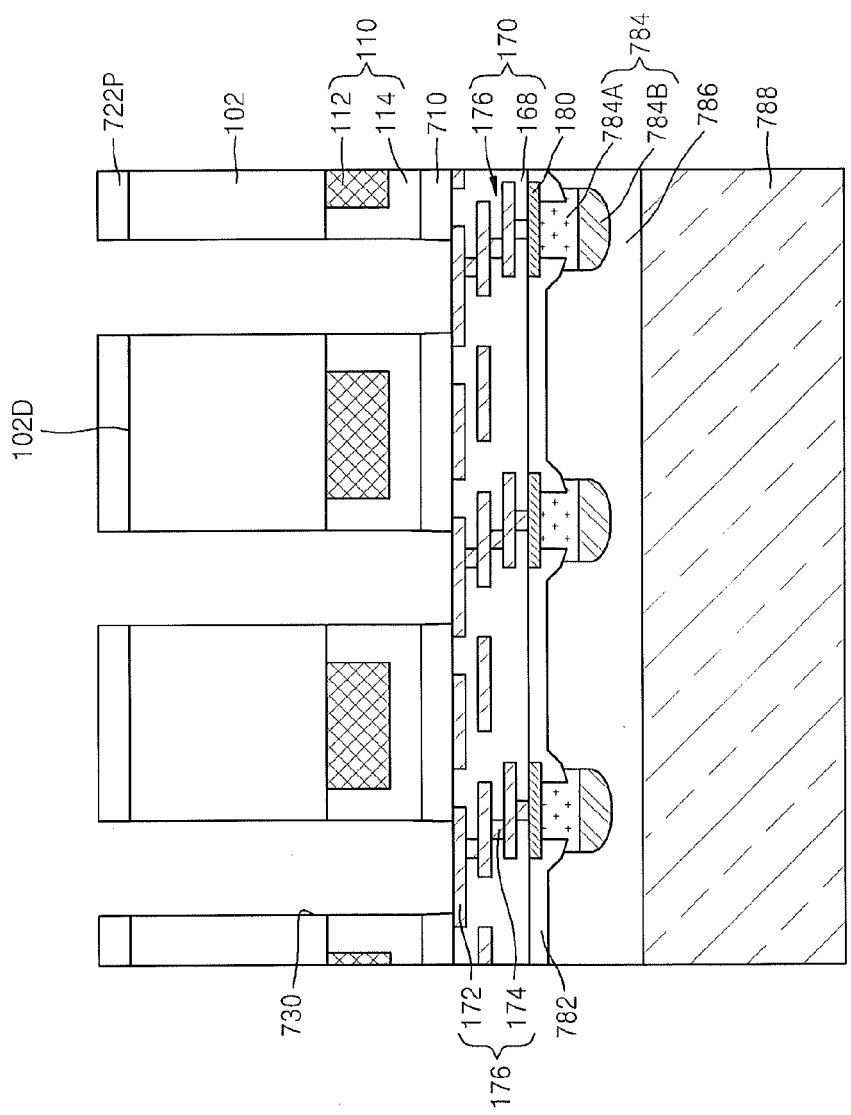

Referring to FIG. 10D, the hard mask layer 722 may be etched by using the mask pattern 724 (see FIG. 10C) as an etch mask to form a hard mask pattern 722P, and the substrate 102 and the etch stopping layer 710 may be etched by using the mask pattern 724 and the hard mask pattern 722P as an etch mask to form a plurality of via holes 730 exposing the metal interconnection line layer 172. The via holes 730 may each extend to pass through the substrate 102 and the interlayer insulating film 114 of the FEOL structure 110.

The via holes 730 may be formed by anisotropic etching or laser drilling. In some embodiments, when the interlayer insulating film 114 is etched to form the via holes 730, an etch stopping point may be determined by using the etch stopping layer 710. The via holes 730 may each have a width of about 10 μm or lower and a depth of about 50 to about 100 μm. However, the width and depth of the via holes 730 are not limited to the ranges described above and may vary according to design purpose. After the via holes 730 are formed, the mask pattern 724 (see FIG. 10C) may be removed to expose a top surface of the hard mask pattern 722P.

Figure 10E:
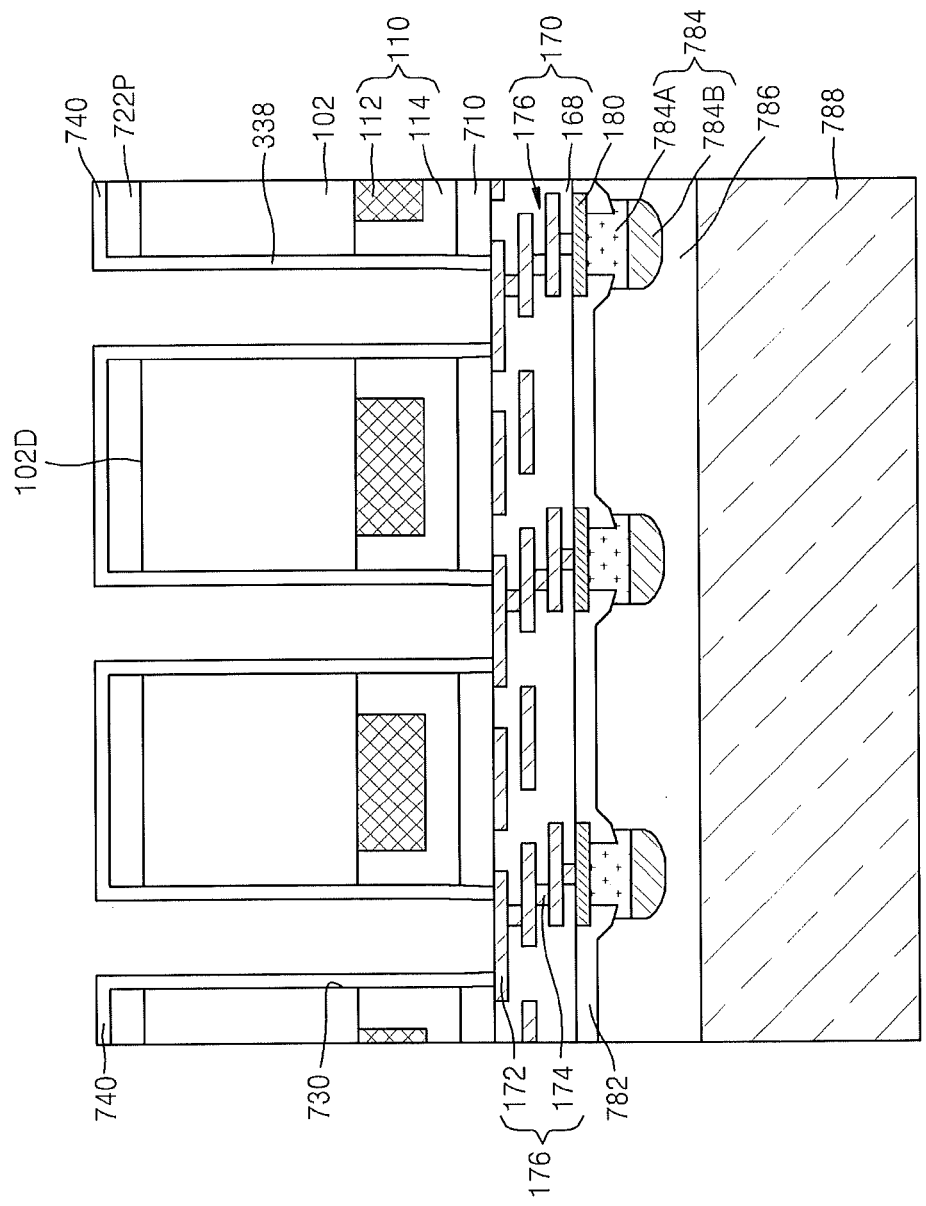

Referring to FIG. 10E, a plurality of via insulating films 740 may be formed to cover an inner sidewall of the via hole 730. In some embodiments, the via insulating films 740 may be formed as follows: first, an insulating film covering inner walls of the via holes 730 and the backside 102D of the substrate 102 may be formed, and, then, a portion of the insulating film may be removed by anisotropic ion etching to expose the metal interconnection line layers 172 in the via holes 730. The insulating film may be formed by using a CVD process. In some embodiments, the via insulating films 740 may be further understood by referring to the description of the via insulating film 140 presented with reference to FIG. 4C.

Figure 10F:
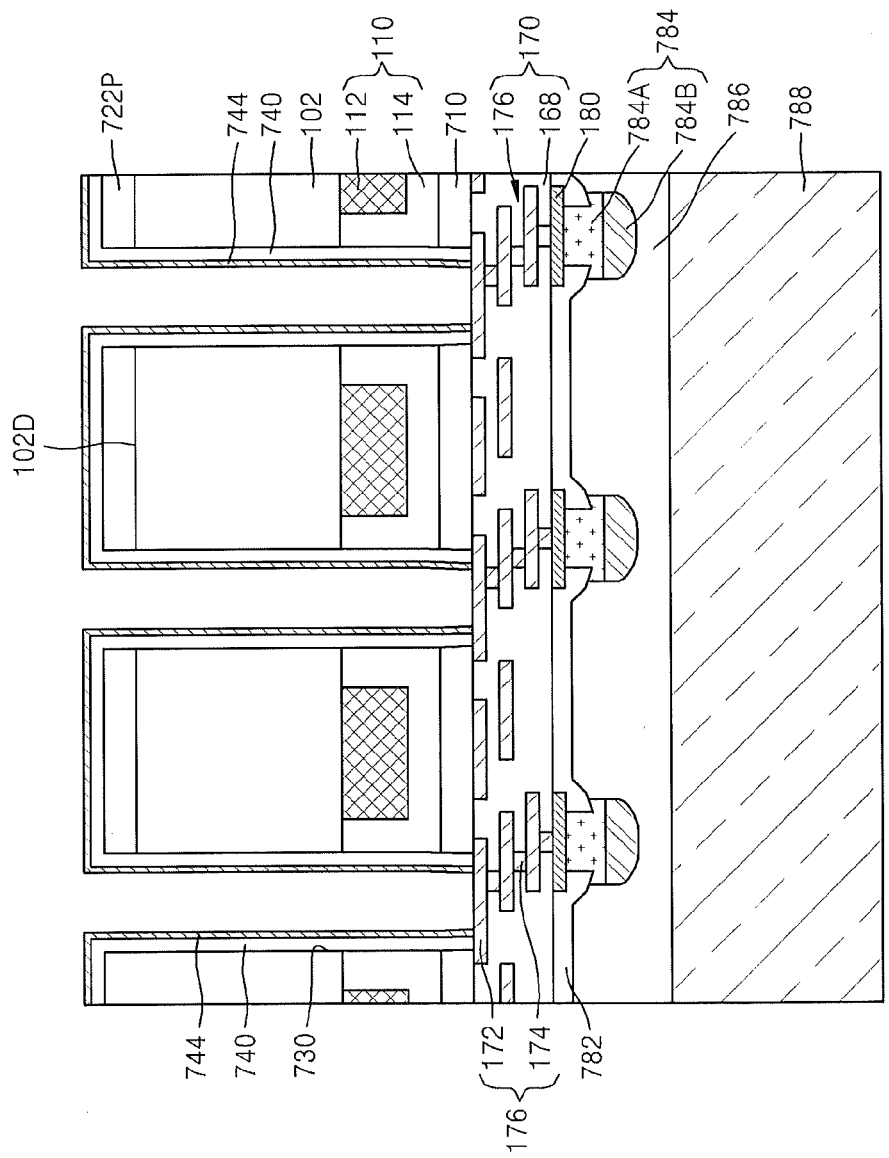

Referring to FIG. 10F, a plurality of first conductive barrier films 744 may be formed on the via insulating films 740 inside and outside the via holes 730. The first conductive barrier films 744 may be formed as follows: a barrier layer may be formed on the exposed surface of the resultant structure including the via insulating films 740, and, then, a portion of the barrier layer may be removed by anisotropic ion etching to expose the metal interconnection line layers 172 in the via holes 730.

The metal interconnection line layers 172 may each contact a portion of the first conductive barrier films 744. The first conductive barrier films 744 may be further understood by referring to the description of the first conductive barrier film 144 presented with reference to FIG. 4D.

Figure 10G:
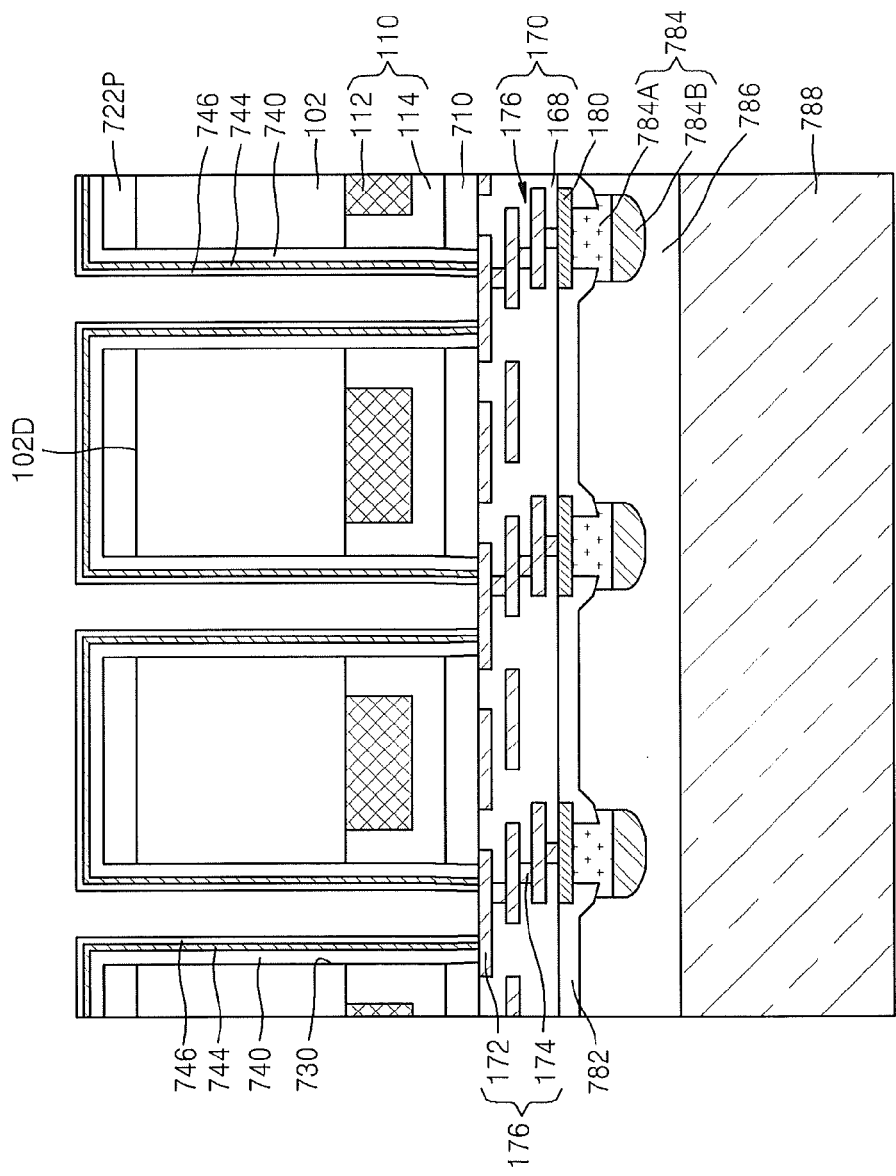

Referring to FIG. 10G, a plurality of insulating thin films 746 covering the first conductive barrier films 744 may be formed. In the via hole 730, the metal interconnection line layers 172 may be exposed by the insulating thin films 746. The insulating thin films 746 may be further understood by referring to the description of the insulating thin film 146 presented with reference to FIG. 4E.

Figure 10H:
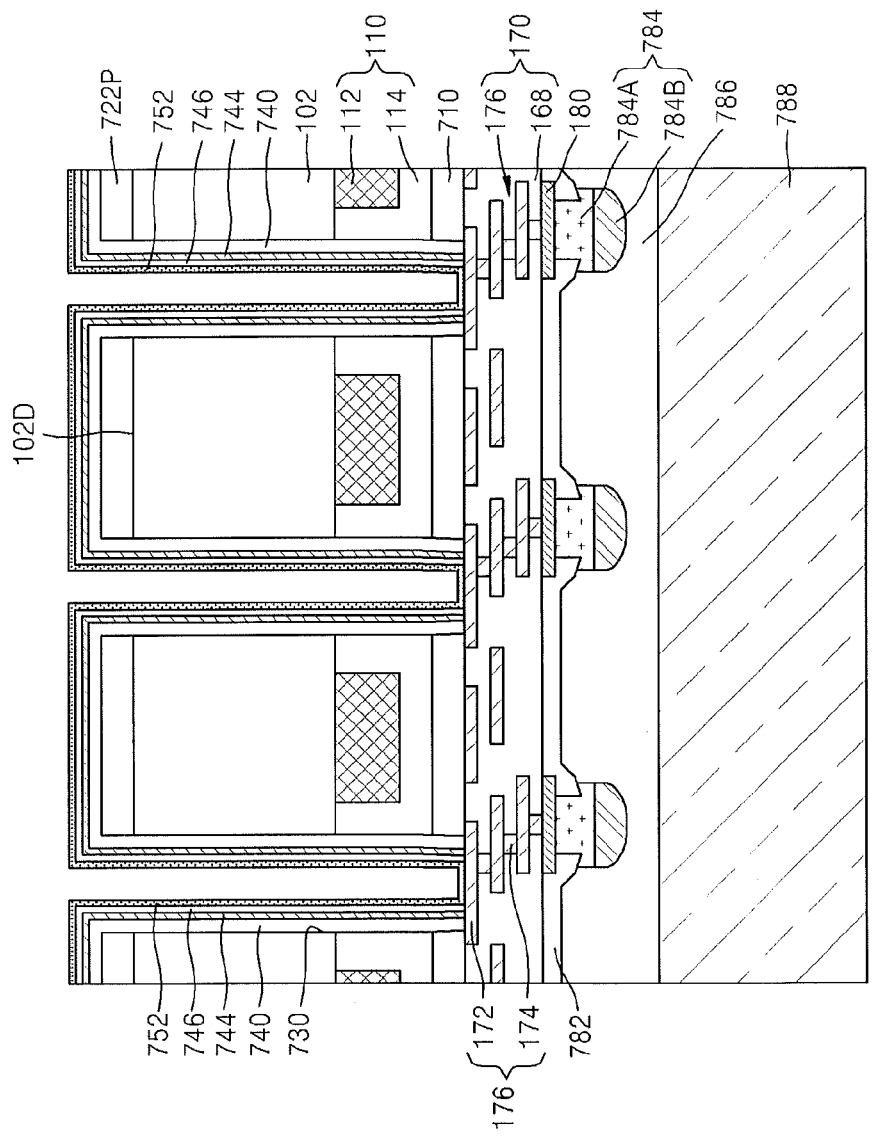

Referring to FIG. 10H, in a manner similar to the process for forming the second conductive barrier film 152 with reference to FIG. 4F, a second conductive barrier film 752 may be formed on the insulating thin films 746 and the metal interconnection line layers 172. In some embodiments, the second conductive barrier film 752 may be formed to have a relatively uniform thickness in the via hole 730. In some embodiments, the second conductive barrier film 752 may be formed to have a variable thickness in the via hole 730. For example, a thickness of a portion of the second conductive barrier film 752 in the vicinity of the inlet of the via hole 730 may be greater than that of a portion of the second conductive barrier film 752 in the vicinity of a lower surface of the via hole 730. In some embodiments, the formation process for the second conductive barrier film 752 may be omitted.

Figure 10I:
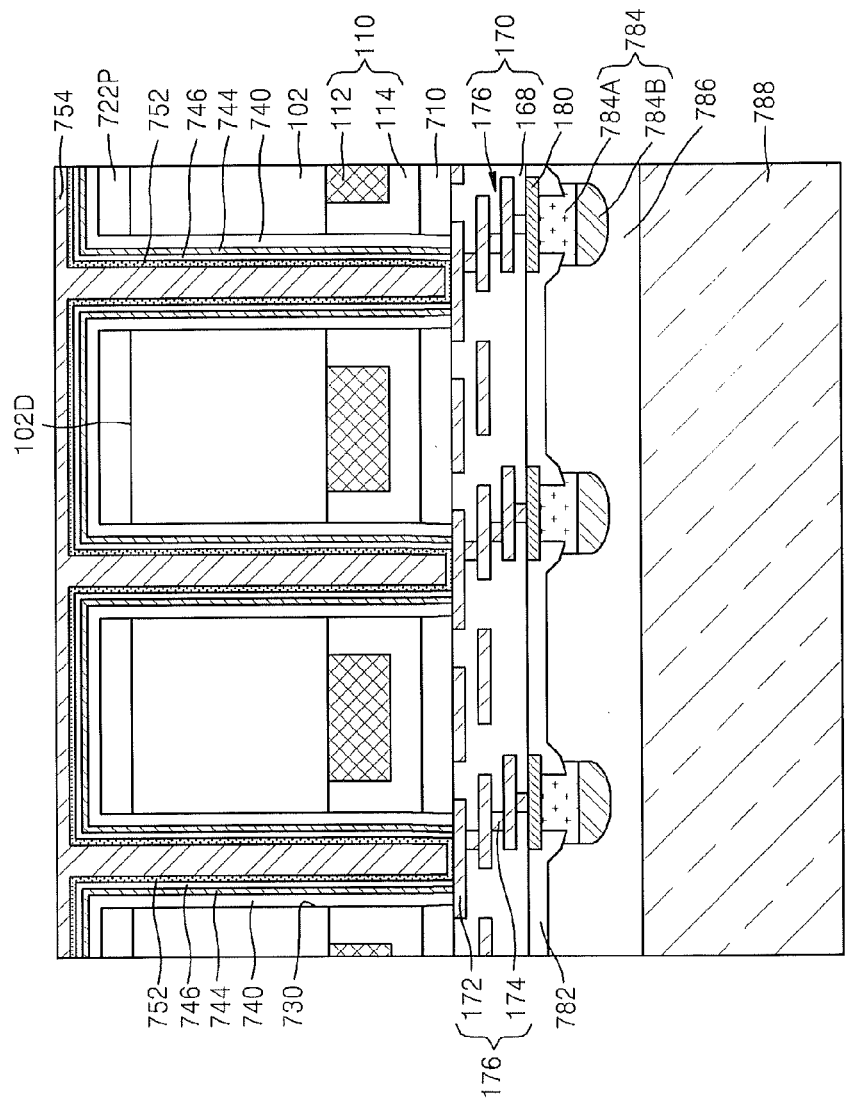

Referring to FIG. 10I, a conductive film 754 may be formed on the second conductive barrier film 752 in the same manner as used to form the conductive/metal film 154 described with reference to FIG. 4G. In embodiments in which the second conductive barrier film 752 is not formed, the conductive film 754 may be formed to directly contact the metal interconnection line layers 172.

Figure 10J:
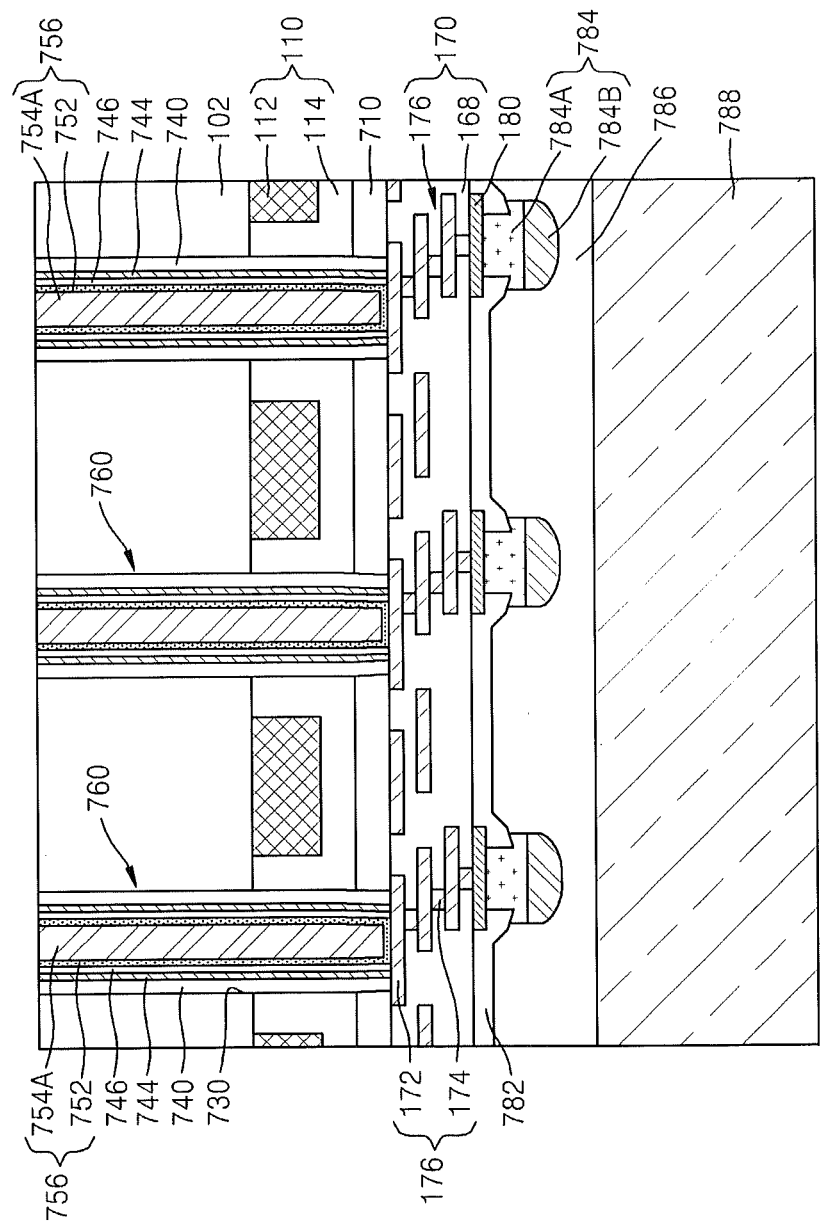

Referring to FIG. 10J, in a manner similar to that described with reference to FIGS. 4H and 4I, the resultant structure of FIG. 10I including the metal film 754 may be polished by using the hard mask pattern 722P (see FIG. 10I) as a stopper, and the hard mask pattern 722P may be removed to expose the substrate 102, thereby forming a conductive plug 756 composed of the second conductive barrier film 752 and the metal plug 754A in each of the via holes 730. The conductive plug 756 may be further understood by referring to the description of the conductive plug 156 presented with reference to FIGS. 4H and 4I. Accordingly, a plurality of TSV structures 760, each including the first conductive barrier film 744, the insulating thin film 746, and the conductive plug 756, may remain in the via holes 730.

Figure 10K:
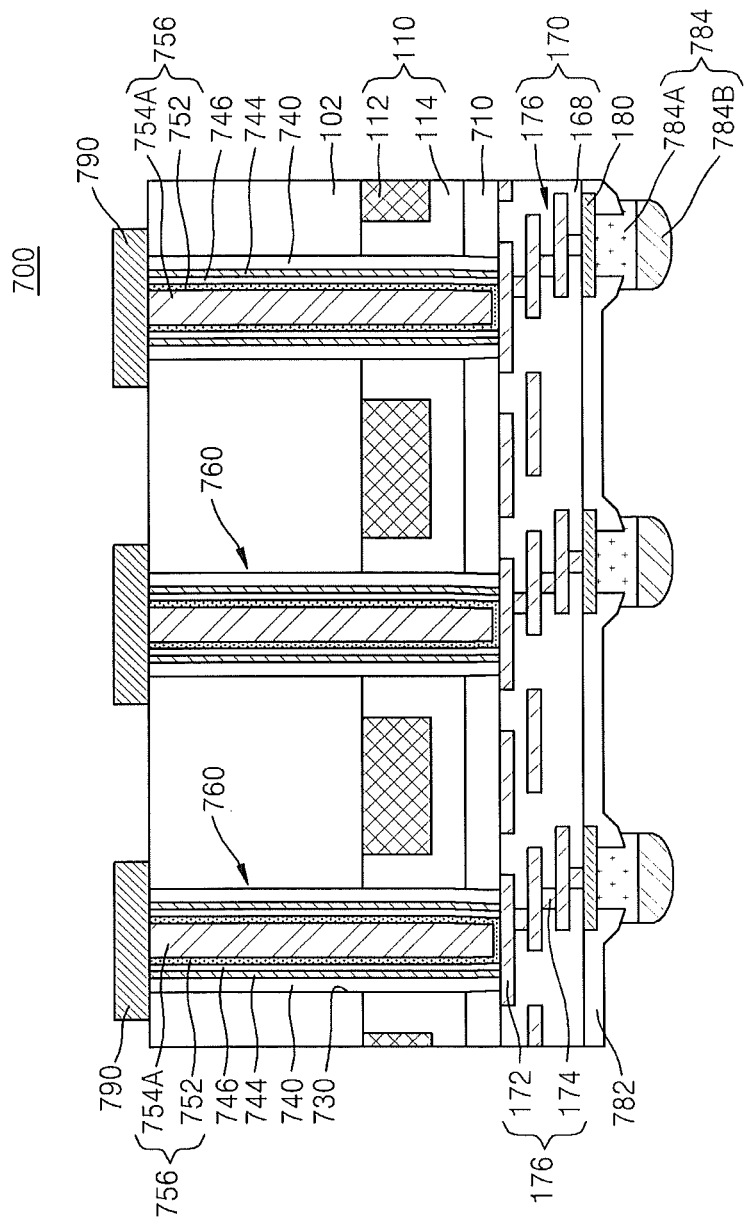

Referring to FIG. 10K, a plurality of contact pads 790 that are electrically connectable to the TSV structures 760 may be formed at the inlets of the via holes 730. In each of the TSV structures 760, the first conductive barrier film 744 and the conductive plug 756 may be spaced apart from each other by the insulating thin film 746, and each of the first conductive barrier film 744 and the conductive plug 756 may contact the contact pad 790. Thereafter, the wafer support substrate 788 and the adhesive coating layer 786 (see FIG. 10J) may be removed to expose the bumps 784 to complete the fabrication of the integrated circuit device 700.

Figure 11:
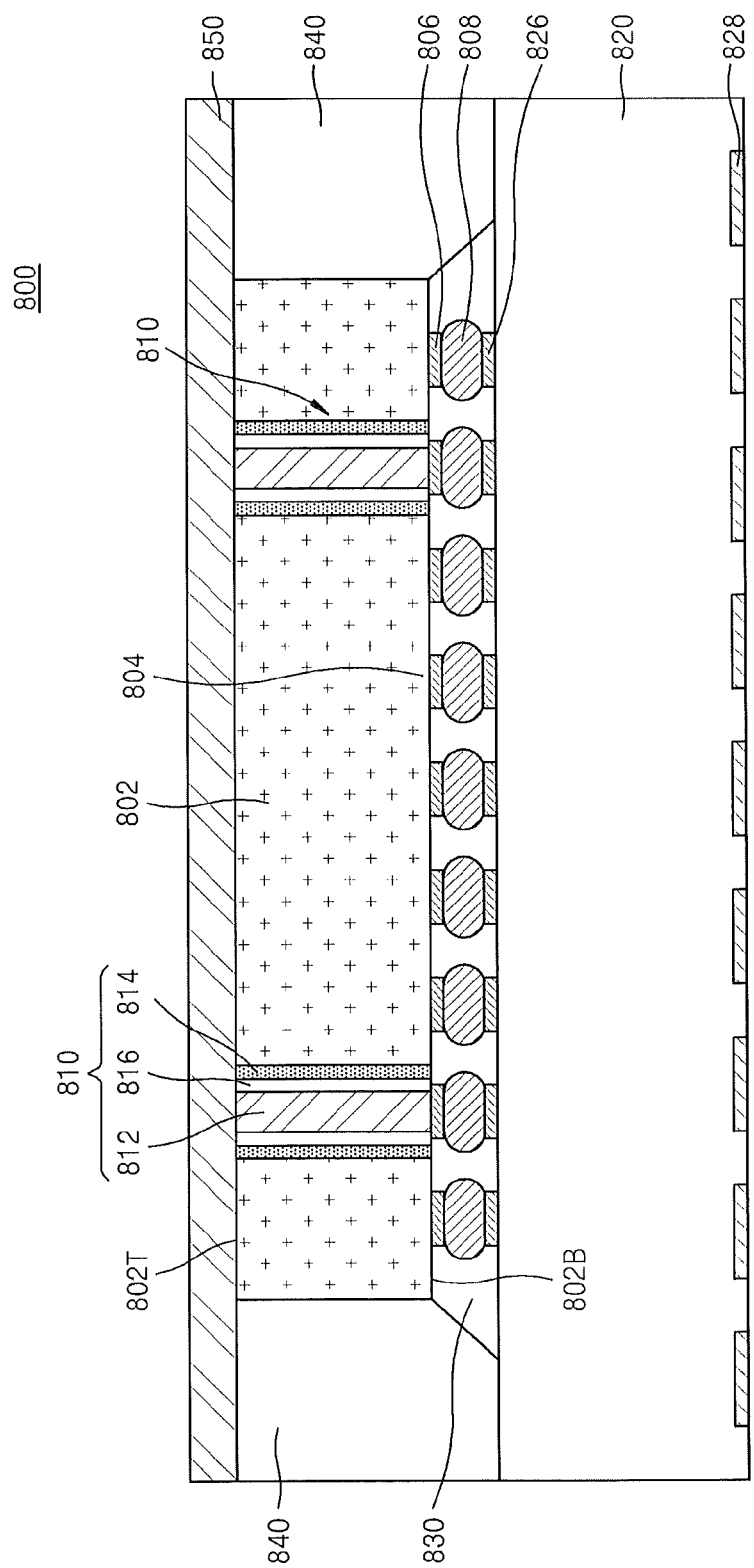
FIGS. 11 and 12 are cross-sectional views illustrating integrated circuit devices according to some embodiments.

FIG. 11 is a cross-sectional view illustrating major elements of an integrated circuit device 800 according to some embodiments. Referring to FIG. 11, the integrated circuit device 800 may include a semiconductor die 802. The semiconductor die 802 may include an active region 804 including an analog or digital circuit. A plurality of solder bumps 808 may be connected to the active region 804 of the semiconductor die 802.

The semiconductor die 802 may have a plurality of TSV structures 810 passing through the semiconductor die 802. The TSV structures 810 may be electrically isolated from the active region 804 of the semiconductor die 802 by a via insulating film.

Each of the TSV structures 810 may include a conductive plug 812, a cylindrical conductive barrier film 814 that is spaced apart from the conductive plug 812 and surrounds the conductive plug 812, and an insulating thin film 816 interposed between the conductive plug 812 and the first conductive barrier film 814.

The conductive plug 812 and the conductive barrier film 814 of the TSV structures 810 may each extend from a side 802T of the semiconductor die 802 to another side 802B of the semiconductor die 802 so as to be electrically connected to the solder bump 808 via a contact pad 806. The semiconductor die 802 may be mounted on a substrate 820. Contact pads 826 and 828 may be formed at both sides of the substrate 820. The solder bumps 808 may be connected to the contact pads 826 formed at one side of the substrate 820. The conductive plug 812 and the conductive barrier film 814 of the TSV structures 810 may each be electrically connected to the contact pad 826 of the substrate 820 through the solder bump 808.

An underfill material layer 830 formed of an epoxy resin or an inorganic material may fill a space between the semiconductor die 802 and the substrate 820. The underfill material layer 830 may protect the contact pads 806 and 826 and the solder bump 808.

A molding compound layer 840 may be deposited on the substrate 820 on opposite sides of the semiconductor die 802. The molding compound layer 840 may be formed of an insulating material. The molding compound layer 840 may protect the semiconductor die 802 from an external environment and pollutants.

A conductive layer 850 may be formed on the semiconductor die 802. The conductive layer 850 may be electrically connected to the contact pad 826 of the substrate 820 through the TSV structures 810. The conductive layer 850 may include a metal or a metal-containing material. The conductive plug 812 and the conductive barrier film 814 of the TSV structures 810 may each be electrically connected to the conductive layer 850. In some embodiments, the conductive layer 850 may be used as a conductive shielding layer to shield against interference between devices, such as electromagnetic interference (EMI) or radio frequency interference (RFI).

Figure 12:
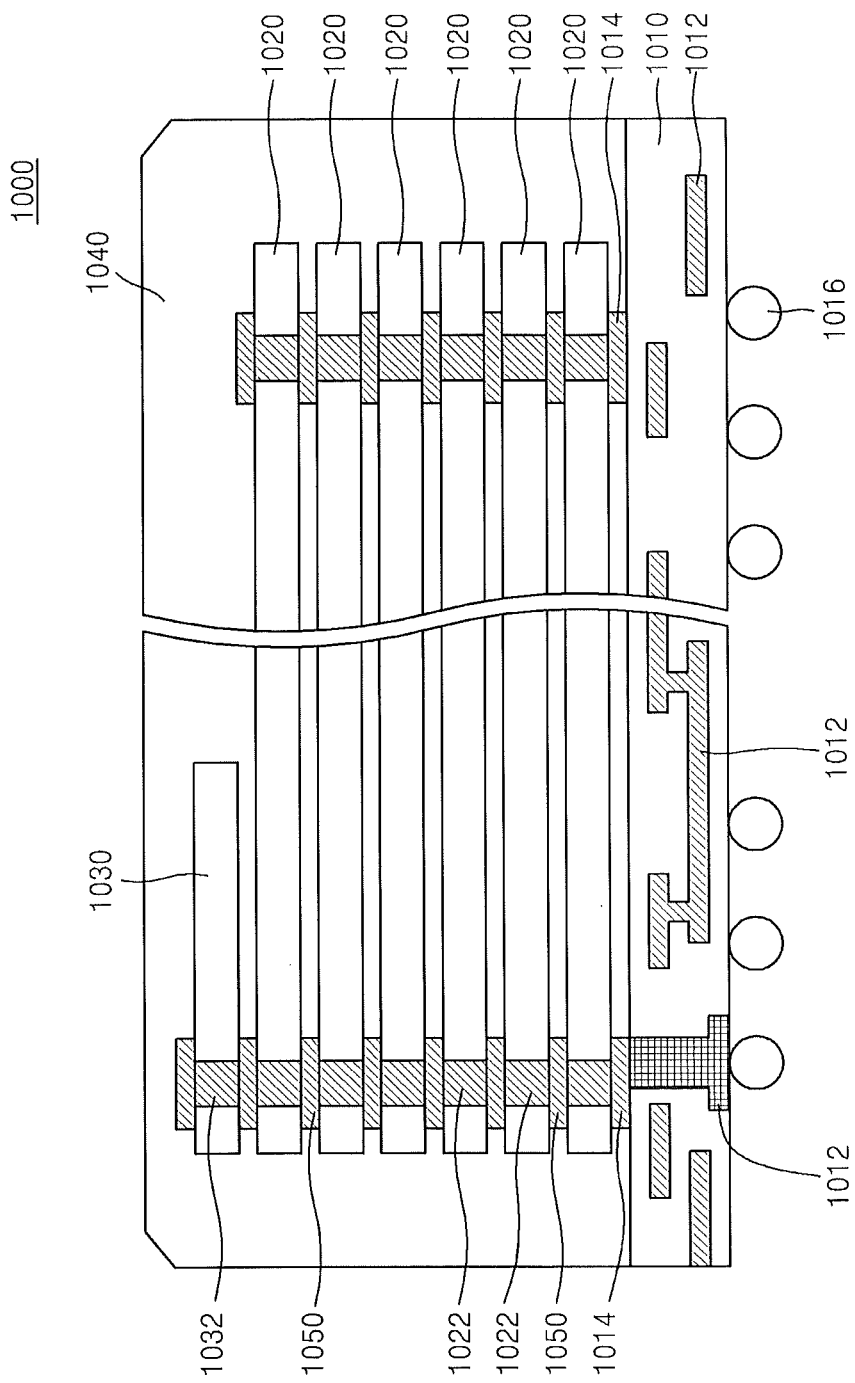

FIG. 12 is a cross-sectional view illustrating major elements of an integrated circuit device 1000 according to some embodiments. Referring to FIG. 12, the integrated circuit device 1000 may include a plurality of semiconductor chips 1020 sequentially stacked on the package substrate 1010. A control chip 1030 may be connected to the semiconductor chips 1020. The stacked structure of the semiconductor chips 1020 and the control chip 1030 may be sealed by an encapsulant 1040, such as a thermosetting resin, on the package substrate 1010. In FIG. 12, six semiconductor chips 1020 are vertically stacked. However, the number of the semiconductor chips 1020 and the stacking direction thereof are not limited thereto. For example, according to design purpose, six or more semiconductor chips 1020 may be used. The semiconductor chips 1020 may be arranged on the package substrate 1010 in a horizontal direction, a vertical direction, or a combination thereof. In some embodiments, the control chip 1030 may be omitted.

The package substrate 1010 may be a flexible printed circuit board, a rigid printed circuit board, or a combination thereof. The package substrate 1010 may include a substrate inner interconnection line 1012 and a connection terminal 1014. The connection terminal 1014 may be formed on a surface of the package substrate 1010. On another surface of the package substrate 1010, there may be formed a solder ball 1016. The connection terminal 1014 may be electrically connected to the solder ball 1016 through the substrate inner interconnection line 1012. In some embodiments, the solder ball 1016 may be replaced with a conductive bump or a lead grid array (LGA).

TSV structures 1022 and 1032 of the semiconductor chips 1020 and the control chip 1030 may be electrically connected to the connection terminal 1014 of the package substrate 1010 by a connection member 1050, such as a bump. In some embodiments, the TSV structure 1032 of the control chip 1030 may be omitted.

At least one of the semiconductor chips 1020 and the control chip 1030 may include at least one of the integrated circuit devices 10A, 10B, 100, 200, 300, 400, 500, 600, 700, and 800 described with reference to FIGS. 1A to 11. At least one of the TSV structures 1022 and 1032 may have a structure of any one of the TSV structures of at least one of the integrated circuit devices 10A, 10B, 100, 200, 300, 400, 500, 600, 700, and 800 described with reference to FIGS. 1A to 11.

The semiconductor chips 1020 may include a system LSI, flash memory, dynamic random-access memory (DRAM), static RAM (SRAM), electrically erasable programmable read-only memory (EEPROM), phase-change RAM (PRAM), magnetoresistive RAM (MRAM), or resistive RAM (RRAM). The control chip 1030 may include a logic circuit, such as a serializer/deserializer (SER/DES) circuit.

Figure 13:
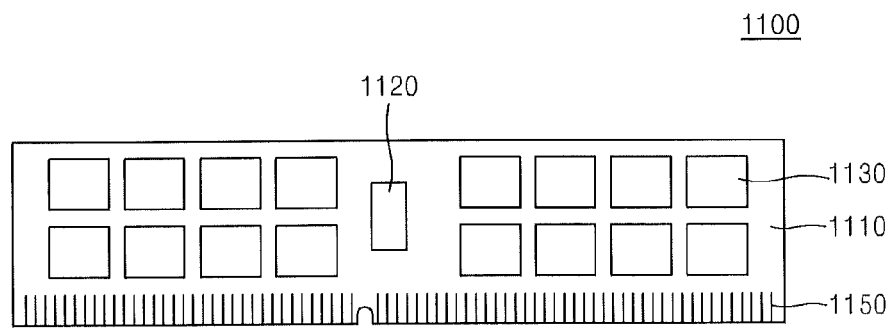
FIG. 13 is a plan view illustrating an integrated circuit device according to some embodiments.

FIG. 13 is a plan view illustrating major elements of an integrated circuit device 1100 according to some embodiments. The integrated circuit device 1100 may include a module substrate 1110, a control chip 1120 mounted on the module substrate 1110, and a plurality of semiconductor packages 1130. The module substrate 1110 may include a plurality of input and output terminals 1150. The semiconductor packages 1130 may include at least one of the integrated circuit devices 10A, 10B, 100, 200, 300, 400, 500, 600, 700, 800, and 1000 described with reference to FIGS. 1A to 12.

Figure 14:
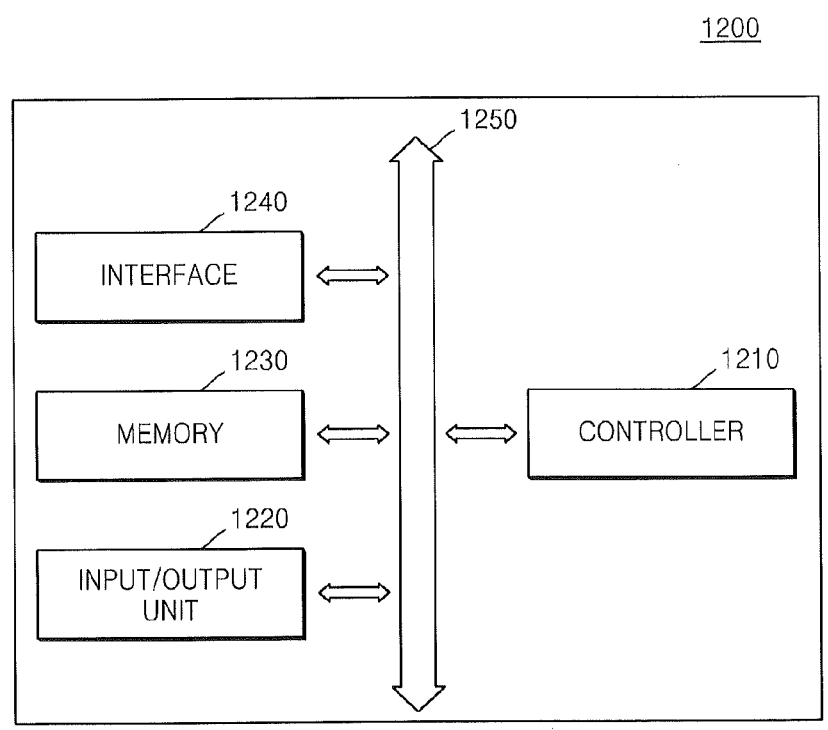
FIG. 14 is a block diagram view illustrating an integrated circuit device according to some embodiments.

FIG. 14 is a diagram illustrating major elements of an integrated circuit device 1200 according to some embodiments. The integrated circuit device 1200 may include a controller 1210, an input/output unit/device 1220, a memory 1230, and an interface 1240. The integrated circuit device 1200 may be a mobile system or a system that transmits or receives information. In some embodiments, the mobile system may include at least one selected from a personal digital assistant (PDA), a portable computer, a web tablet, a wireless phone, a mobile phone, a digital music player, and a memory card.

In some embodiments, the controller 1210 may be a microprocessor, a digital signal processor, or a microcontroller micro-controller. The input/output unit/device 1220 may be used for the data input/output of the integrated circuit device 1200. The integrated circuit device 1200 may be connected to an external device, for example, a personal computer or a network, by using the input/output unit/device 1220, and may exchange data with the external device. In some embodiments, the input/output unit/device 1220 may be a keypad, a keyboard, or a display.

In some embodiments, the memory 1230 may store code and/or data for the operation of the controller 1210. In some embodiments, the memory 1230 stores data that is processed by the controller 1210. The controller 1210 and the memory 1230 may each include at least one of the integrated circuit devices 10A, 10B, 100, 200, 300, 400, 500, 600, 700, 800, 1000, and 1100 described with reference to FIGS. 1A to 13.

The interface 1240 may function as a data transmission passage between the integrated circuit device 1200 and other external devices. The controller 1210, the input/output device 1220, the memory 1230, and the interface 1240 may communicate with each other via a bus 1250. The integrated circuit device 1200 may be included in a mobile phone, an MP3 player, a navigation system, a portable multimedia player (PMP), a solid state disk (SSD), or a household appliance.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
a semiconductor structure; and
a through-silicon-via (TSV) structure in the semiconductor structure,
wherein the TSV structure comprises:
a conductive plug;
a conductive barrier film spaced apart from the conductive plug and surrounding the conductive plug; and
an insulating thin film between the conductive plug and the conductive barrier film.

2. The integrated circuit device of claim 1, wherein:
the conductive plug comprises a first metal; and
the conductive barrier film comprises a second metal different from the first metal.

3. The integrated circuit device of claim 1, further comprising a via insulating film between the semiconductor structure and the conductive barrier film.

4. The integrated circuit device of claim 3, wherein the insulating thin film comprises a first thickness and the via insulating film comprises a second thickness thicker than the first thickness.

5. The integrated circuit device of claim 1, further comprising a conductive layer on a surface of the semiconductor structure and contacting an end of the conductive plug and an end of the conductive barrier film.

6. The integrated circuit device of claim 5, wherein:
the end of the conductive plug comprises a first end of the conductive plug;
the end of the conductive barrier film comprises a first end of the conductive barrier film;
the surface comprises a first surface;
the conductive layer comprises a first conductive layer on the first surface; and
the integrated circuit device further comprises:
a second conductive layer on a second surface of the semiconductor structure opposite the first surface, the second conductive layer contacting a second end of the conductive plug and a second end of the conductive barrier film.

7. The integrated circuit device of claim 6, wherein the conductive plug and the conductive barrier film are configured to be electrically connected to each other via the first conductive layer and the second conductive layer such that the conductive plug and the conductive barrier film share an equipotential state.

8. The integrated circuit device of claim 1, wherein the conductive barrier film comprises a substantially uniform thickness in a lengthwise direction of the TSV structure.

9. The integrated circuit device of claim 1, wherein the insulating thin film comprises a substantially uniform thickness in a lengthwise direction of the TSV structure.

10. The integrated circuit device of claim 1, wherein:
the conductive barrier film comprises a first conductive barrier film; and
the conductive plug comprises:
a metal plug in the semiconductor structure and surrounded by the insulating thin film; and
a second conductive barrier film surrounding the metal plug between the metal plug and the insulating thin film.

11. The integrated circuit device of claim 10, wherein:
the first conductive barrier film comprises a substantially uniform thickness in a lengthwise direction of the TSV structure; and
the second conductive barrier film comprises a variable thickness in a lengthwise direction of the TSV structure.

12. The integrated circuit device of claim 1, wherein:
the semiconductor structure comprises a semiconductor substrate and an interlayer insulating film on the semiconductor substrate; and
the conductive plug, the insulating thin film, and the conductive barrier film each extend in the semiconductor substrate and the interlayer insulating film.

13. The integrated circuit device of claim 1, wherein:
the semiconductor structure comprises a semiconductor substrate, an interlayer insulating film on the semiconductor substrate, and a metal interlayer insulating film on the interlayer insulating film, and
the conductive plug, the insulating thin film, and the conductive barrier film each extend in the semiconductor substrate, the interlayer insulating film, and the metal interlayer insulating film.

14. An integrated circuit device comprising:
a semiconductor structure comprising first and second portions;
a via structure between the first and second portions of the semiconductor structure, the via structure comprising:
a conductive plug;
a conductive barrier layer spaced apart from the conductive plug; and
an insulating layer between the conductive plug and conductive barrier layer.

15. The integrated circuit device of claim 14, further comprising a conductive layer on an end of the conductive plug and an end of the conductive barrier layer.

16. The integrated circuit device of claim 15, wherein the conductive layer extends from a surface of the first portion of the semiconductor structure to a surface of the second portion of the semiconductor structure.

17. The integrated circuit device of claim 16, wherein the surface of the first portion of the semiconductor structure, the surface of the second portion of the semiconductor structure, the end of the conductive plug, and the end of the conductive barrier layer are substantially coplanar.

18. The integrated circuit device of claim 14, wherein:
the via structure comprises a through-silicon-via structure;
the conductive barrier layer comprises a first conductive barrier layer;
the conductive plug comprises:
a metal plug; and
a second conductive barrier layer between the insulating layer and the metal plug; and
the second conductive barrier layer comprises a non-uniform thickness.

* * * * *